(12) United States Patent
Ferraiolo et al.

(10) Patent No.: US 7,443,940 B2
(45) Date of Patent: Oct. 28, 2008

(54) ALIGNMENT MODE SELECTION MECHANISM FOR ELASTIC INTERFACE

(75) Inventors: Frank D. Ferraiolo, New Windsor, NY (US); Gary A. Peterson, Rochester, MN (US); Robert J. Reese, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 608 days.

(21) Appl. No.: 11/055,841

(22) Filed: Feb. 11, 2005

(65) Prior Publication Data
US 2006/0181914 A1    Aug. 17, 2006

(51) Int. Cl.
*H04L 25/00* (2006.01)
(52) U.S. Cl. ........................ 375/372; 713/401
(58) Field of Classification Search ................ 375/371, 375/372, 360, 359, 354; 713/400, 401, 503
See application file for complete search history.

(56) References Cited

U.S. PATENT DOCUMENTS 6,400,642 B1 *   6/2002   Mehrotra et al. ............ 365/233
6,603,706 B1 *   8/2003   Nystuen et al. ............. 365/233

* cited by examiner

*Primary Examiner*—Kevin Y Kim
(74) *Attorney, Agent, or Firm*—Casimer K. Salys; Winstead, P.C.

(57) ABSTRACT

Methods and apparatus are disclosed for aligning received data bits in elastic interface systems. Depending upon which one of several alignment modes is selected, data bits can be loaded into FIFO latches on rising clock edges if the data was sent on rising clock edges, on falling clock edges if the data was sent on falling clock edges, or on the nearest clock edge if minimum latency is desired. Alternatively, data bits can be delayed by one or more bit times before loading into FIFO latches to reduce the elastic interface system's sensitivity to drift. The present invention permits a user to trade off factors related to for latency, drift, and skew by choosing among different alignment modes in an elastic interface system.

14 Claims, 24 Drawing Sheets

ALIGNMENT MODE SELECTION MECHANISM FOR ELASTIC INTERFACE

TECHNICAL FIELD

The present invention relates in general to data processing systems, and in particular, to mechanisms for communicating data between integrated circuits.

BACKGROUND INFORMATION

Modern data processing systems require the rapid transfer of data between integrated circuits ("chips"). For example, a central processing unit (CPU) transfers data to the memory system, which may include a memory controller and off-chip cache. In a multi-CPU system, data may be transferred between CPUs. As CPU speeds increase, the speed of the interface between chips (bus cycle time) becomes a limiting constraint because latencies across the interfaces may exceed the system clock period.

When data is launched from one chip to another chip, it can be launched simultaneously within numerous clock/data groups. Each clock/data group consists of multiple data bits and a clock signal, each of which travels over an individual conductor. Due to process variations and varying conductor lengths, the individual bits within a clock/data group may arrive at the receiving chip at different instances. Therefore, the individual bits of data and the clock within a clock/data group must be realigned upon arrival on the receiving chip. At the receiving end, the clock/data signals can be delayed to align the signals with respect to a sampling edge of the received clock. While it is necessary to align the individual data bits within a clock/data group at the receiving end, such delays can cause jitter and other forms of distortion. In addition to causing jitter and distortion, delaying data signals can require extensive administrative overhead and additional circuitry.

In order to process a plurality of skewed data bits, some systems employ an elastic interface. Some systems of elastic interface incorporate a per-bit de-skew mechanism in which the slowest (latest-arriving) bit in a clock group is identified and all earlier bits have delay added such that they become just as late as the latest bit. The sampling clock is then delayed such that it is centered on the de-skewed data bit's "data window" or "data window." This de-skew method therefore requires extensive state machine-based overhead to identify the latest bit, and also requires data delay lines that are long enough to cover the maximum skew between the earliest and latest bit in the clock group. It then requires more state machine-based overhead to identify the edges of the data eye along with overhead for calculating a clock delay value that would center the clock on that eye. Furthermore, the clock edge which launches the data at the driver is also the clock edge which captures the data on the receiver, and as such, tight controls of the relationship between the clock and data path are required to achieve optimal performance.

With many elastic interface designs, a double data rate (DDR) signaling method is employed, with the "even" data beats launched on the rising clock edge and the "odd" data beats launched on the falling clock edge. This scheme gives rise to different alignment situations. When the data arrives at the receiver, each bit may have a different amount of delay, and if a bit is de-skewed to the closest clock edge, it may be sampled with either a rising or falling edge (whichever is closest). Similarly, odd data beats might be de-skewed and sampled on either rising or falling clock edges. These de- skew/sampling situations give rise to different methods of fully aligning all the bits on the bus to optimize different performance aspects.

Thus, there is a need in the art for methods and apparatuses that enable choosing from among more than one alignment modes in elastic interface systems.

SUMMARY OF THE INVENTION

The present invention provides methods and apparatuses that enable choosing from among more than one alignment mode in elastic interface systems. In a first embodiment, a method is provided for receiving a transmission of digital data in an elastic interface system. A clock/data group is received on a bus. The clock/data group has a clock signal having a plurality of clock edges. The clock/data group also has a plurality of data bits that have a plurality of even data beats and a plurality of odd data beats. The plurality of data bits are launched substantially simultaneously. The plurality of data bits have per-bit skew upon receiving, with a latest data bit. Each of the plurality of received data bits is delayed individually to center its data window with the nearest rising or falling clock edge. The method also includes the step of determining a latest bit from the plurality of deskewed (delayed) data bits. If an align-to-closest-edge mode has been selected and the latest bit was delayed to center its data windows with the plurality of rising clock edges, the method includes loading the latest data bit's plurality of even data beats into a plurality of even FIFO latches. However, if an align-to-closest-edge mode has been selected and the latest data bit was delayed to center its data windows with the plurality of falling clock edges, then the method includes loading the latest data bit's plurality of even data beats into a plurality of odd FIFO latches.

BRIEF DESCRIPTION OF THE DRAWINGS

For a more complete understanding of the present invention and its advantages, refer to the following description taken in conjunction with the accompanying drawings, in which:

FIG. 11 is an example of a busy IAP pattern for use in an embodiment of the present invention;

DETAILED DESCRIPTION

Figure 1A:
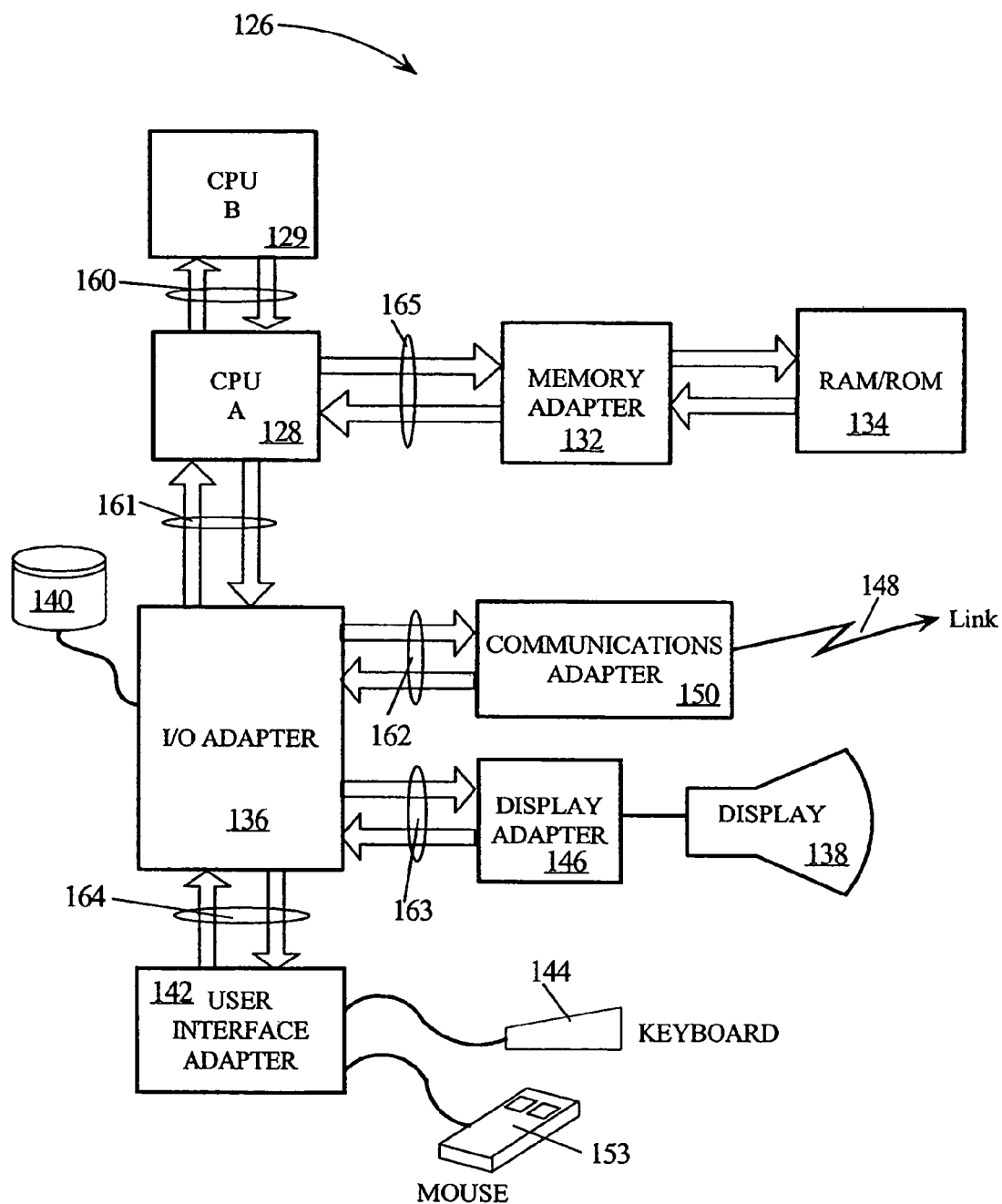
FIG. 1A is a data processing system that is a representative hardware environment for practicing the present invention.

In the following description, numerous specific details are set forth such as specific data bit lengths, ranges of delay times, and interface alignment patterns, to provide a thorough understanding of the present invention. However, it will be obvious to those skilled in the art that the present invention may be practiced without such specific details. In other instances, well-known circuits have been shown in block diagram form in order not to obscure the present invention in unnecessary detail. Some details concerning timing considerations, detection logic, and the like have been omitted inasmuch as such details are not necessary to obtain a complete understanding of the present invention and are within the skills of persons of ordinary skill in the relevant art. Refer now to the drawings wherein depicted elements are not necessarily shown to scale and like or similar elements may be designated by the same reference numeral through the several views.

FIG. 1A is a high level functional block diagram of a representative data processing system 126 suitable for practicing the present invention. Data processing system 126 includes central processing systems (CPU) 128 and 129. More than two (or a single) CPUs are possible and would be within the scope of the present invention. CPU 128 and CPU 129 are coupled with bus 160 and CPU 128 is coupled to I/O adapter 136 with bus 161 and to memory adapter 132 with bus 165. Memory adapter 132 is also coupled to read-only memory (ROM) and random access memory (RAM) in memory unit 134. System buses (e.g., 160-165) may operate in accordance with a standard bus protocol, such as the ISA protocol, compatible with CPUs 128 and 129. Among other things, the ROM in memory 132 supports storage of the BIOS (basic input output system) data and recovery code. The ROM in memory 132 may be an electronically erasable programmable ROM or other such types of read-only memory. The RAM in memory unit 134 includes, for example, DRAM (dynamic random access memory) system memory and SRAM (static random access memory) external cache. I/O adapter 136 allows for an interconnection between the devices. I/O adapter 136 is coupled to communications adapter 150 with bus 162 which may send and receive data on communications link 148. I/O adapter 136 also couples to display adapter 146 which is in turn coupled to a display 138 for displaying video and text information. I/O adapter 136 also couples to external peripherals, such as mass storage devices 140 (e.g., a hard drive, floppy drive, printer or CD/ROM drive). A peripheral device 140 is, for example, coupled to a PCI (peripheral control interface) bus, and therefore I/O adapter 136 may be a PCI bus bridge. User interface adapter 142 couples to I/O adapter 136 with bus 164 and to various user input devices, such as a keyboard 144 or mouse 153. Display 138 which may be, for example, a cathode ray tube (CRT), liquid crystal display (LCD) or similar conventional display units. Display adapter 146 may include, among other things, a conventional display controller and frame buffer memory. Communications adapter 150 may include, for example, a modem for connection to a telecom network and/or hardware and software for connecting to a computer network such as a local area network (LAN) or a wide area network (WAN). Buses 160-165 may be elastic interface buses with driver and receiver chips that de-skew and align data bits in accordance with the principles of the present invention.

The present invention can be practiced on data processing systems that use "elastic interface" buses (for example, buses 160-165, FIG. 1A) for data communication. An "elastic interface" bus consists of a number of data/address/control signals divided into "clock/data" groups. Each clock/data group consists of a reasonable number of data signals (usually single-ended) associated with a clock signal (also referred to herein as a "clock"). The clock signal may consist of a differential pair made up of a clock signal and its complement. The number of data signals associated with a clock signal can be limited to minimize the amount of skew between the data bits and the clock signal.

Figure 1B:
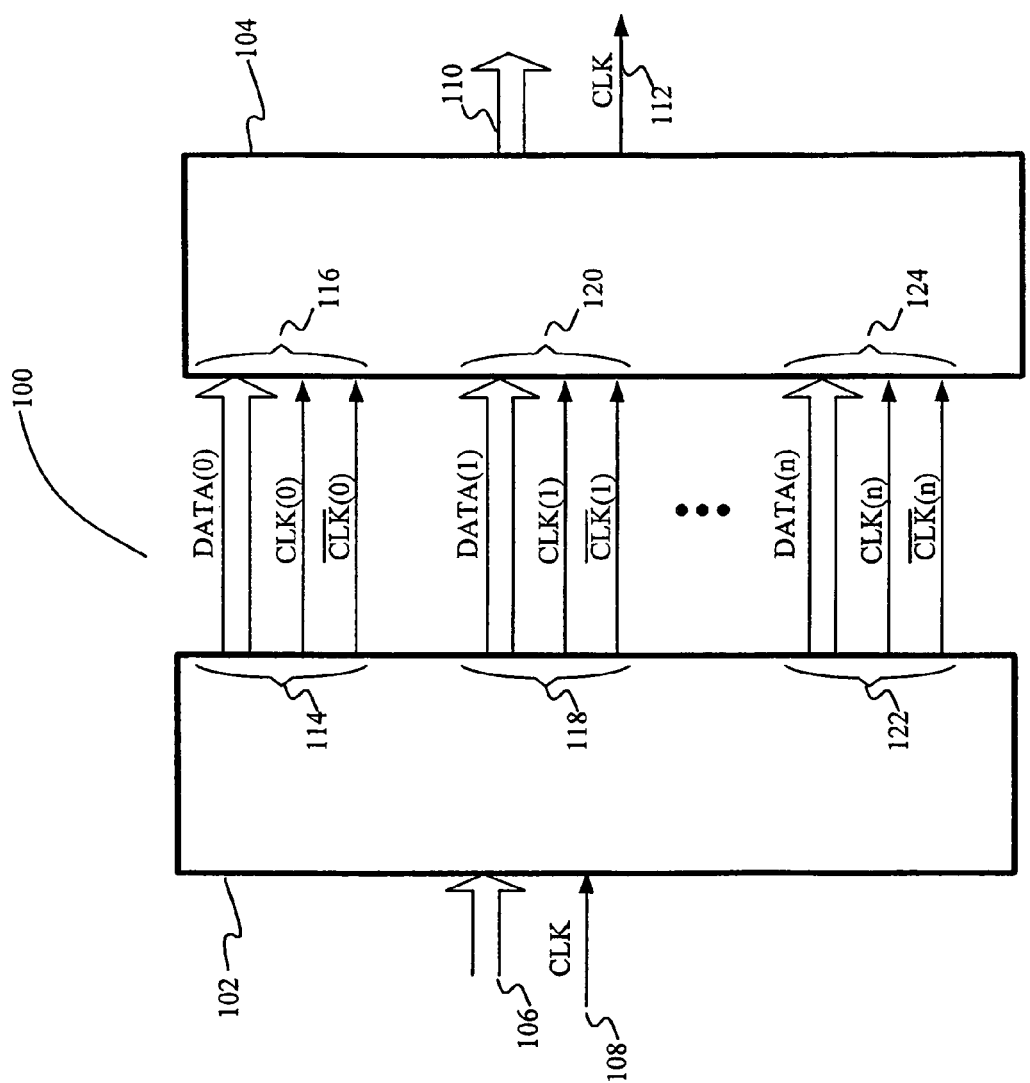
FIG. 1B illustrates, in block diagram form, a chip interface configured in accordance with an embodiment of the present invention.

FIG. 1B illustrates inter-chip communication occurring between a chip driver 102 and a receiver chip 104 over an elastic interface bus ("elastic bus") 100. The elastic bus 100 consists of a number of data, address, and control signals divided into clock/data groups. Signal 106 represents data signals transmitted to chip driver 102. Signal 110 represents data signal transmitted from receiver chip 104. Clock signal 112 represents one or more system clock signals transmitted from receiver chip 104. Clock signal 108 represents one or more system clocks transmitted to chip driver 102. Items 114, 118, and 122 represent three clock/data groups. Each clock/data group 114, 118, and 122 consists of a reasonable number of data signals (usually single-ended) associated with a clock signal. As shown in clock/data groups 114, 118, and 122, a clock signal may consist of a differential pair of clock signals. The number of data signals within the clock/data group (and associated with a clock signal) can be limited to minimize the amount of skew between the data bit and the clock signal, since a larger number of data bits entails more difficulty in wiring from driver to receiver while maintaining equal signal wire lengths and thus reasonable skew values.

During inter-chip communication, data on a driver side chip is launched simultaneously within a clock/data group across the entire bus, with both the data and clocks being precisely aligned at the driver's outputs. Standard DDR (double-data rate) driving can be utilized, in which a new beat of data is launched on both the rising and falling edges of the clock.

Data on the receiver side can arrive at varied times for each bit in a clock/data group. The difference in time of arrival between bits is commonly referred to as "per-bit skew" or "intra-clock group skew." Also, data between different clock/data groups can arrive a different times. This delay is commonly referred to as "inter-clock group skew." Within receivers that implement an elastic interface, any early data bits within a clock group are delayed, as needed, such that each received data bit's data eye is centered on the nearest clock edge. Centering each data bit's data eye on the nearest clock edge helps to ensure that data is optimally sampled into one or more latches clocked by the received clock. These sampled data can then be further delayed by one to three additional bit times, or possibly more, to de-skew all the data bits within the clock/data group to a common point.

This optimally sampled and de-skewed data for each bit can be loaded into a FIFO (First-In First-Out) buffer commonly referred to as the "elastic buffer." The depth of the FIFO buffer can vary, however, a typical FIFO buffer may be eight data beats deep. Data can then be withdrawn from the FIFO using the receiving chip's "local" clock, and forwarded to the operative portion (commonly referred to as "the guts") of the receiving chip. The FIFO for each data bit thereby allows an inter-chip communication system to compensate for variable transit times for data in different clock groups (or different buses). Clock groups or buses which have a shorter transit delay will have the data delayed for a longer time, thus allowing the data across a bus or buses to be forwarded simultaneously to the guts of the receiving chip.

In FIG. 1B, data is launched from chip driver 102 simultaneously across the entire bus, with the data and clock signals within the clock/data groups 114, 118, and 122 being precisely aligned at the output of the chip driver 102. Data arriving at receiver chip 104 can have per-bit skew due to process variations and varying lengths in conductor paths. Between different clock/data groups, additional skew may also exist (inter-clock group skew). Within the receiver chip 104, each data bit within the received clock/data groups 116, 120 and 124 has delay added in accordance with the present invention, such that each received data bit's data eye is centered on the nearest clock edge of the received clock. By centering the data eye on a nearest clock edge, the data can be optimally sampled into a latch that is clocked by the received clock. These sampled data can be further delayed by one to three additional bit times (or more, depending upon available circuitry) to de-skew all the data bits within a clock group to a common point. In other words, the sampled data is further delayed so that corresponding beats (for example, beat 0, beat 1, etc.) for each data bit align.

Figure 2:
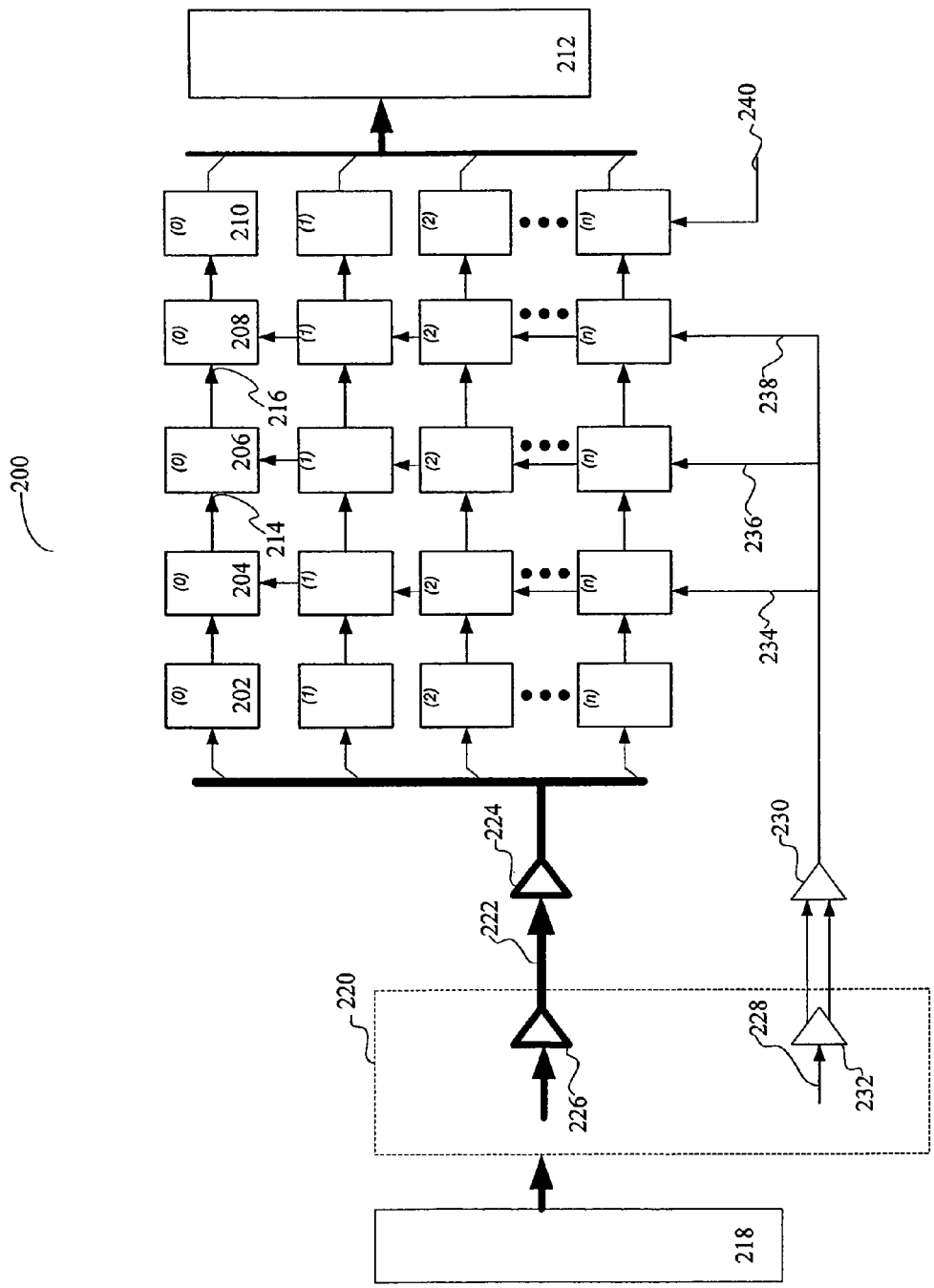
FIG. 2 represents a block diagram for an elastic interface clock/data group processed in accordance with an embodiment of the present invention.

Referring now to FIG. 2, block diagram 200 provides an operational overview of an elastic interface arranged in accordance with an embodiment of the present invention. Item 218 represents first chip data source on a chip driver, (for example, chip driver 102 from FIG. 1B). Item 220 represents second chip boundary latches/drivers 226 and a differential clock generator 232 coupled to clock signal 228 for launching data bits and clock signals simultaneously. On the receiving end, second chip differential clock receiver 230 is for receiving two differential clock signals from clock generator 232. Signal 240 represents one or more local clock signals on the receiving chip. Second chip data receiver 224 receives data bits on line 222. Second chip data receiver 224 and second chip differential receiver 230 may reside, for example, on the receiving chip 104 (FIG. 1B). Data lines 234, 236 and 238 distribute the received I/O clock signal from differential clock receiver 230. At a receiver chip (such as receiver chip 104 from FIG. 1B), varied amounts of transit delay result in the individual data bits received by data receiver 224 having per-bit skew. This per-bit skew among the various data bits can result in a narrowing, if not a complete elimination, of the data eye. In addition, the differential clock signals received by differential clock receiver 230 may not align properly with the data from line 222.

As shown in FIG. 2, elements 202, 204, 206, 208, and 210 all relate to de-skew and alignment of data bit #0 within a clock/data group. Likewise, the corresponding circuit elements below elements 202, 204, 206, 208, and 210 correspond to the other bits (bits #1 through #n) within the clock/data group. For the purpose of simplicity and to facilitate understanding, only data bit #0 ("bit 0") and its associated circuit elements (items 202-210) are addressed in this text.

Delay line 202 is a variable delay element that delays data bit 0 so that the center of an eye diagram made up of consecutive beats of data bit 0 is centered around the nearest edge of the received clock signal, received from differential clock receiver 230. An example of delay line 202 is shown as delay line 1400 in FIG. 14. Likewise, each of the other data bits (bits 1 through n) is aligned with the closest clock edge (rising or falling). This alignment allows optimal sampling of each bit in the middle of its data eye. Each data bit may also be delayed by 1-3 extra bit times (or more) using additional sample de-skew latches to further compensate for bit skews that are greater than one bit time. The purpose of sampling latches 204 is to de-skew a data bit so that the bit's data eyes are aligned with the nearest clock edge (rising or falling). Sampled data is transmitted from sampling latches 204 over line 214 to sample de-skew latches 206. Additional delays equal to whole bit times may be added using de-skew latches 206. From sample de-skew latches 206, sampled data is further transmitted on line 216 to FIFO latches 208. From FIFO latches 208, data is further transmitted to local latches 210 and combined with other data bits for sending to a second chip data destination 212 (the "guts" of the receiver chip). Local latches 210 are used for withdrawing data from FIFO latches 208 using the receiving chip's local clock signal 240.

Figure 3A:
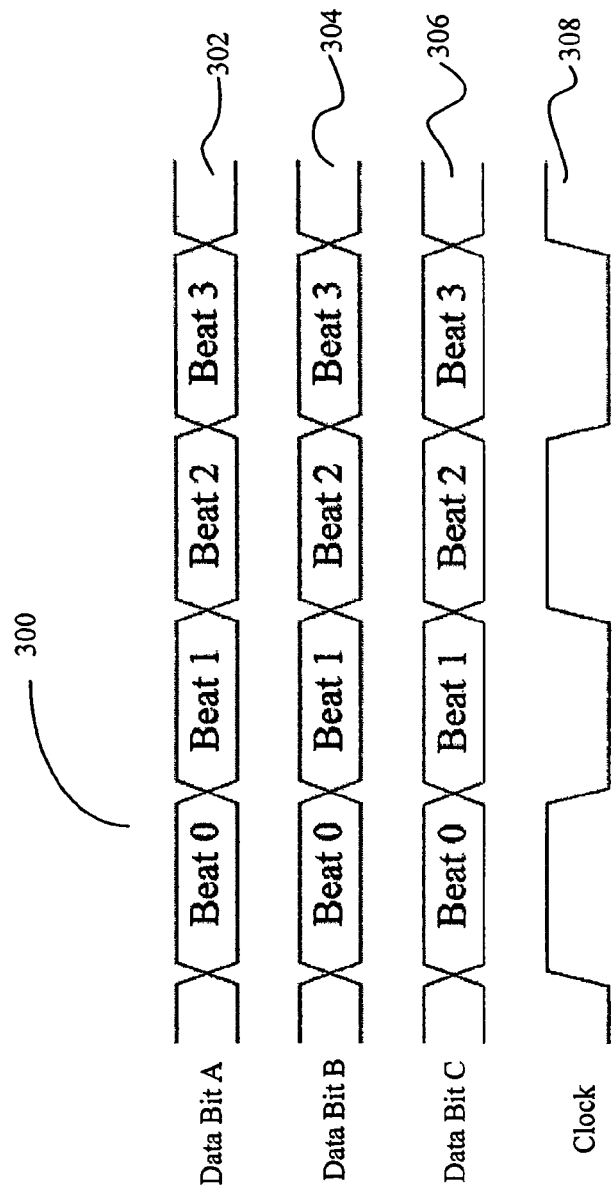
FIG. 3A is a timing diagram for a clock/data group and shows the relative timing for beats at launch time.

FIG. 3A shows a timing diagram for a clock/data group's individual data bits (Data Bit A, Data Bit B, and Data Bit C) launched from a chip driver (such as chip driver 102 from FIG. 1B) over an elastic interface to a receiver chip (such as chip chip receiver 104 from FIG. 1B). Though clock/data group 300 is made up of three raw data signals 302, 304, and 306, any number of data bits is possible. Clock/data group 300 has a clock signal 308, which is transmitted concomitantly with data bits 302, 304, and 306. At the source driver, raw data signals 302, 304, 306 may be edge-aligned with clock signal 308. Further, as shown, the data bits 302, 304, and 306 are launched at a double-data rate (DDR). In other words, both rising and falling edges of clock signal 308 trigger the launch of data from data bits 302, 304, 306. As a result, data bits 302, 304, and 306 are all edge-aligned with clock signal 308 upon launching from the source driver (such as chip driver 102 from FIG. 1B).

Figure 3B:
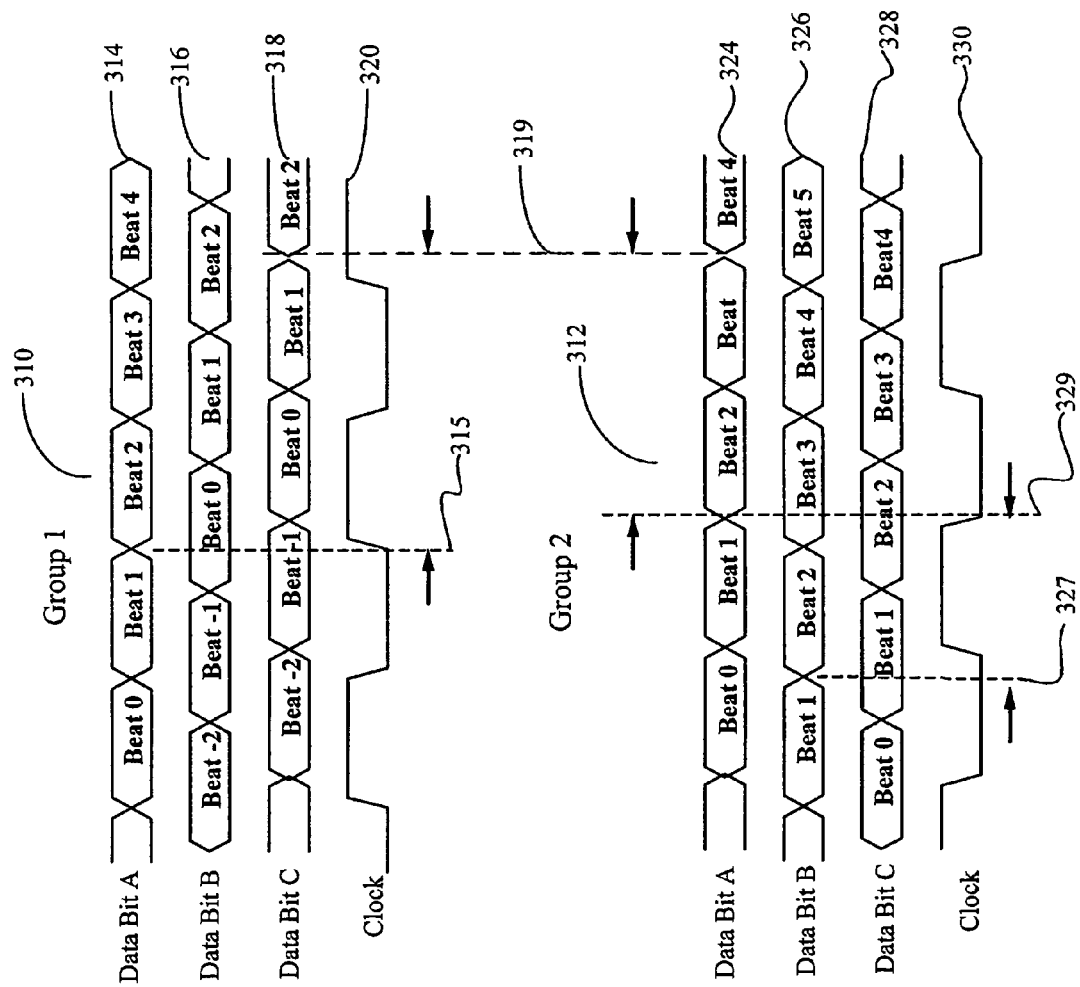
FIG. 3B is a timing diagram for two clock/data groups that are received and are in need of de-skewing and alignment in accordance with an embodiment of the present invention.

FIG. 3B shows a first clock/data group 310 received by a receiver (for example, chip receiver 104 from FIG. 1B). Clock/data group 312 is a second clock/data group that is also received by the receiver. As shown in clock/data group 310, data bit 314 reaches the receiver before data bit 318. In other words, at point 315, the receiver has received beat 1 from data bit 314; however, the receiver is receiving beat −1 from data bit 318. The receiver has not received beat 1 from data bit 318 until point 319. Accordingly, the amount of time between point 319 and point 315 is the per-bit skew between data bit 314 and data bit 318.

Figure 3C:
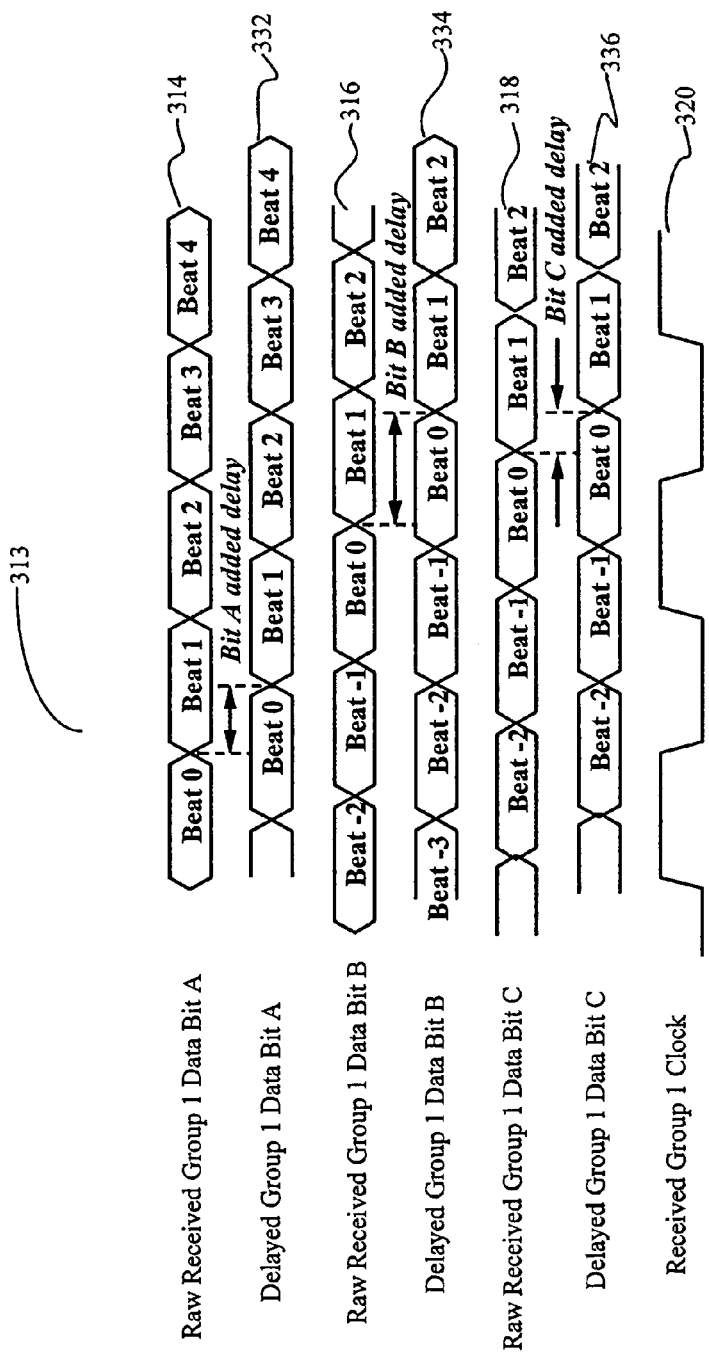
FIG. 3C is a timing diagram for clock/data Group 1 (from FIG. 3B) comparing raw received data to delayed data.

Also, in FIG. 3B, clock/data group 312 represents a second clock/data group sent from a source driver (such as chip driver 102 from FIG. 1B) over an elastic interface to the receiver (such as chip receiver 104 from FIG. 1B). As shown at point 329, the receiver is between beat 1 and beat 2 for data bit 324 and is receiving beat 2 from data bit 328. This indicates that in clock/group 312, data bit 328 is received before data bit 324. However, data bit 326 is the first to reach the receiver. FIG. 3B shows this because at point 329, the receiver is receiving beat 3 from data bit 326, and the receiver has not yet fully received beat 2 from either data bit 324 or data bit 328 at point 329. Therefore, to de-skew the data bits in clock/data group 312, data bit 326 must be delayed from point 327 to point 329 so that the first beats (beat 1 for each) from data bit 324 and data bit 326 are aligned at the nearest clock edge (in this case, a falling clock delayed data bit 332. Because data bit 332 has already been delayed by less than one bit time as shown in FIG. 3C to align its data eyes with the nearest clock edge (rising or falling) of clock 320, data bit 338 represents a data bit which has been delayed twice—once by a fine delay and again by a gross delay. In this example, the time difference between point 337 and 339 equals two bit times. This delay of two bit times is a predictable value determined by the clock frequency. Achieving such delays can optimally be accomplished by the use of simple latches in accordance with an embodiment of the present invention. Using simple latches to delay each data bit by whole bit times results in the introduction of less jitter and noise in the received clock/data group and thereby contributes to faster bus speeds and overall system performance.

Figure 4A:
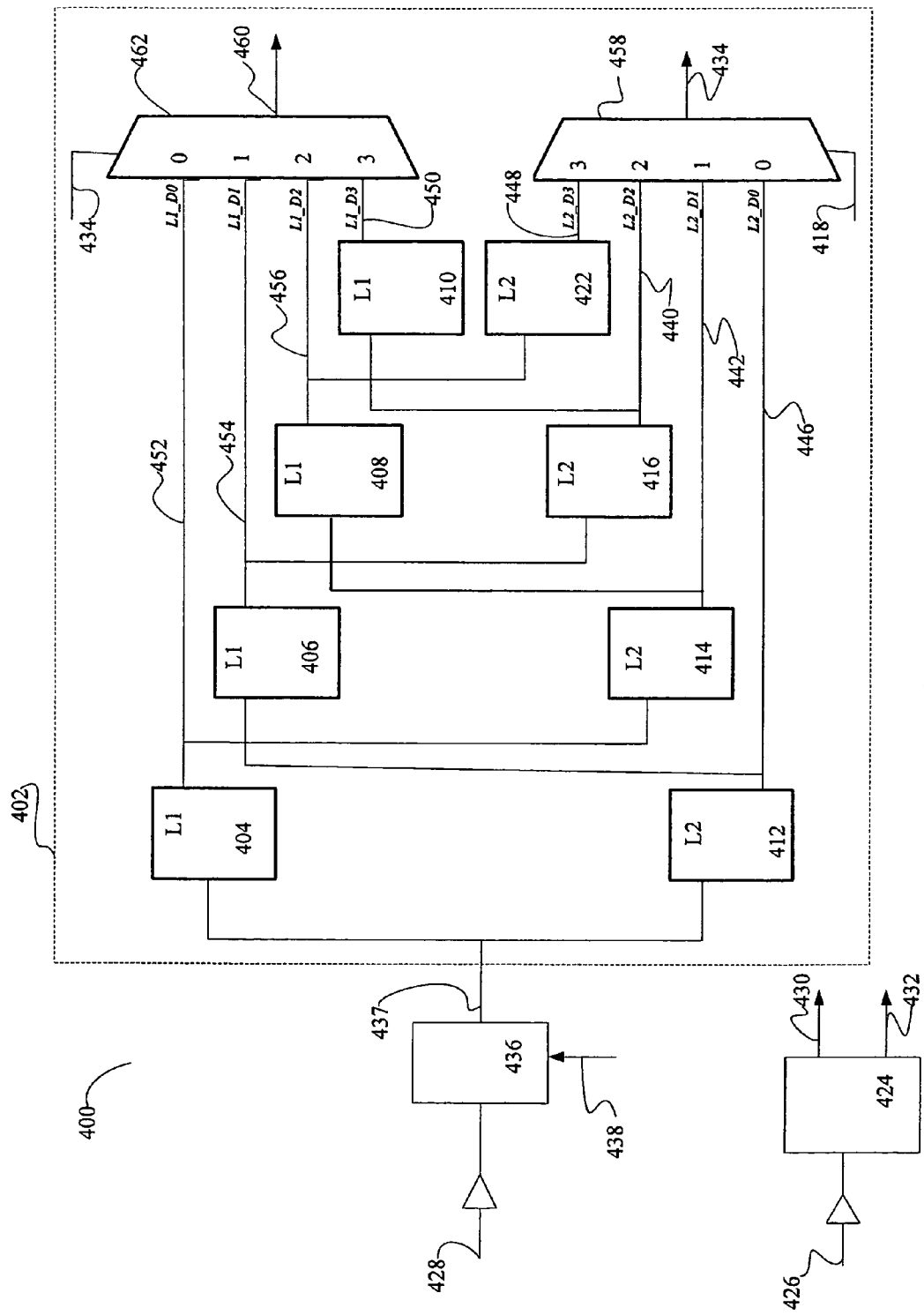
FIG. 4A is a block diagram of a functional sampler used in accordance with an embodiment of the present invention.
Figure 4B:
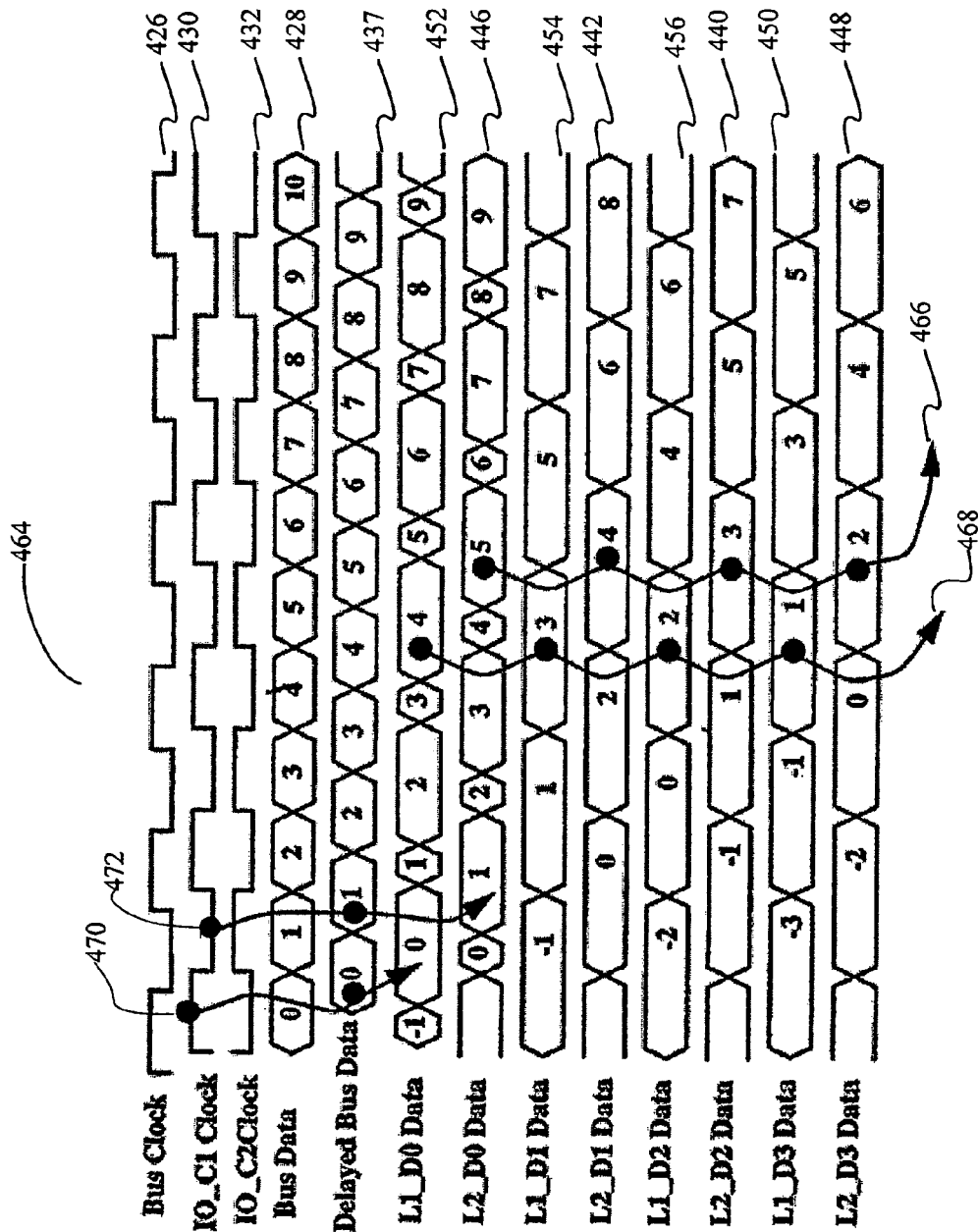
FIG. 4B is a timing diagram showing voltage levels of components from the functional sampler shown in FIG. 4A.
Figure 14:
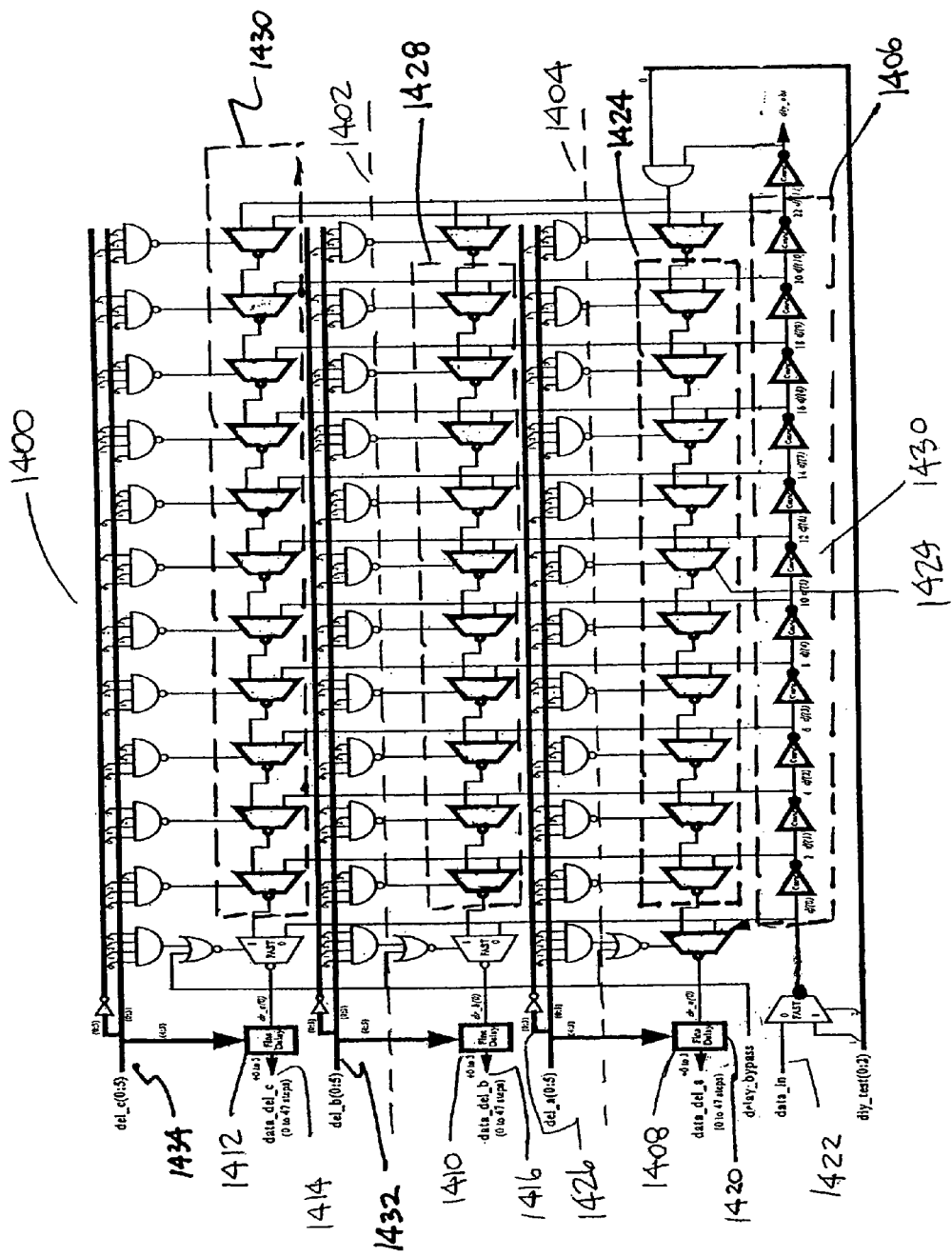
FIG. 14 is a block diagram of a 3-tap, 48-step data delay line for use in an embodiment of the present invention.

FIG. 4A illustrates a de-skewing circuit 400 for one embodiment of the present invention. The circuit 400 is used to further delay the delayed and sampled bus data by 1, 2, or 3 additional bit times. Timing diagrams for circuit 400 are shown in FIG. 4B. In the illustrated embodiment, latches 404, 406, 408, and 410 are level-sensitive, transparent latches (i.e., LSSD style/transparent latches). Likewise, L2 latches 412, 414, 416 and 422 are level-sensitive and transparent. Programmable delay line 436 receives bus data on line 428 and delays it in proportion to the delay signal 438. Delay line 436 can be implemented as shown in FIG. 14. As shown in FIG. 4, circuit 400 provides the ability to delay a delayed and sampled bus data bit by an additional 1, 2, or 3 half-clock cycles.

Referring now to FIGS. 4A and 4B together, waveform set 464 (FIG. 4B) represents waveforms of clock signals, bus signals, and data signals at various locations from the circuitry shown in FIG. 4A. For example, bus clock signal 426 is the bus clock signal coupled to the input of clock generator/splitter 424. I/O clock signal 430 is the complement of I/O clock signal 432. I/O clock signal 430 is fed to all L1 latches 404, 406, 408, and 410. Likewise, I/O clock signal 432 is fed to all L2 latches 412, 414, and 416. As shown at points 470 and 472 (FIG. 4B), the centers of consecutive beats of I/O clock signal 430 correspond to edges of delayed bus data signal 437. This is because the data beats from delayed bus data signal 437 are centered (the data eyes are centered) edge) at point 329 on clock 330. Likewise, data bit 328 will be delayed so that beat 1 is aligned with the falling clock edge at point 329. When viewed together, clock/data groups 310 and 312 show that among different clock/data groups, the same bit (for example, data bit C) can be the fastest bit (data bit 328) in one clock/data group and the slowest bit (data bit 318) in another clock/data group.

Figure 3D:
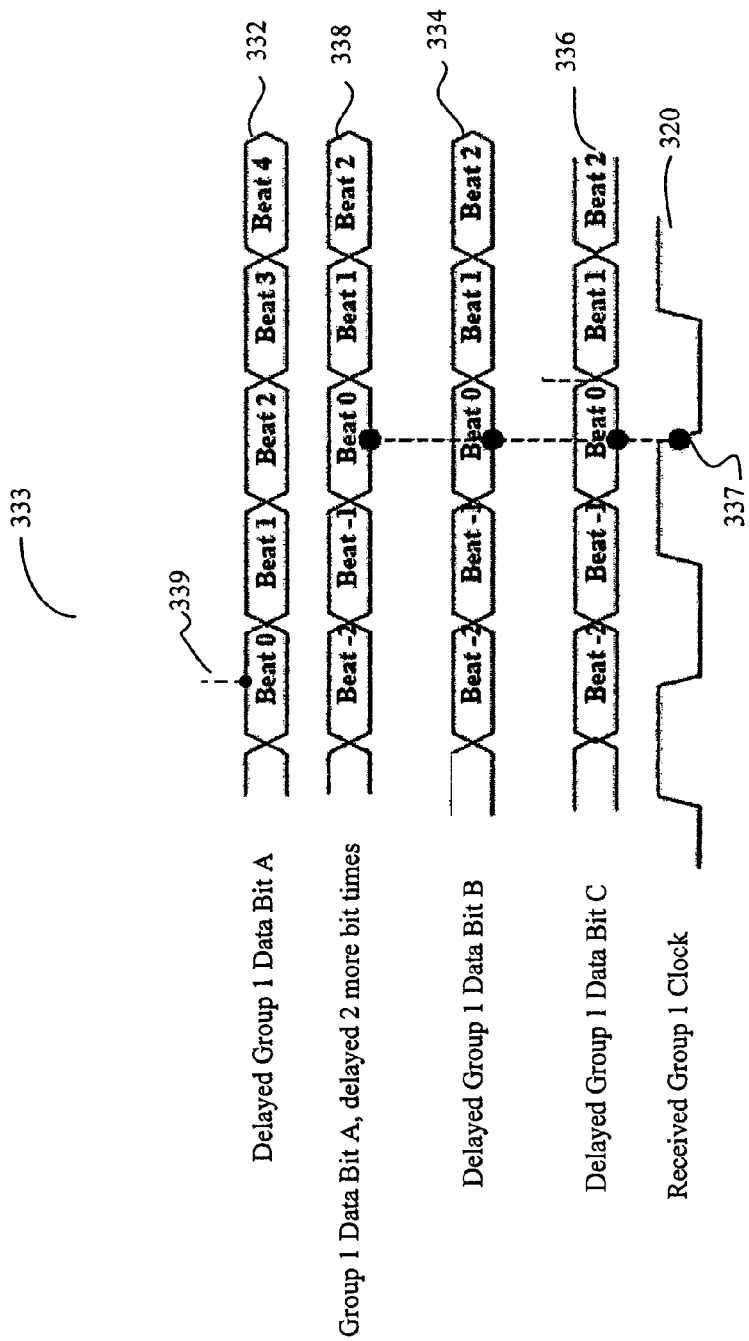
FIG. 3D is a timing diagram showing Group 1 data (from FIG. 3B) with data bit A aligned with the other bits by further delaying it by two bit times.

FIG. 3C represents timing diagram 313 for three bits within a clock/data group, such as clock/data group 310 from FIG. 3B. Timing diagram 313 shows both raw (un-delayed) data bits in addition to delayed data bits. Like-numbered data bits from FIGS. 3B and 3C correspond. Data bit 314 represents a raw, received waveform (data bit A from data clock group 1, item 310 in FIG. 3B). Data bit 332 represents data bit 314 delayed by, at most, one bit time to align the data eye centers of data bit 332 with the nearest clock edge (either rising or falling) of received clock 320. Likewise, data bit 334 represents a delayed version of data bit 316 which has been delayed to align the data eye centers of data bit 334 with the nearest clock edge (rising or falling) from received clock 320. Similarly, data bit 336 represents a delayed version of data bit 318 so that the data eye centers of data bit 336 are aligned with the nearest clock edge (rising or falling) of received clock 320. Therefore, each data bit (data bits 314, 316, 318) from clock group 1 shown as item 310 (FIG. 3B) is delayed the amount of time necessary to align its data eye centers with the nearest clock edges of received clock 320. These delays depicted and shown in FIG. 3C represent a "fine" delay (as opposed to a "gross" or "coarse" delay). Such de-skewing aligns all data bits consistently to a received clock; however, if a slow data bit is skewed by more than one bit time when compared to a faster data bit, then the receiver must further delay the faster bit by whole bit times to align corresponding beats in all data bits. FIG. 3D shows timing diagrams of data bits subjected to such further delays to align the data beats.

In FIG. 3D, timing diagram 333 represents clock/data group 1 (clock/data group 310 from FIG. 3B) after the data beats from the individual data bits (data bits 314, 316, and 318 from FIG. 3B) have been aligned to synchronize data beats 0, 1, 2 and so on. Data bit 332 must be delayed from point 339 to point 337 to align the beat 0's from each of data bits 332, 334, 336. Data bit 338 represents a further delayed version of at rising and falling edges of clock signal 430. Bus data signal 428 represents raw bus data that is fed to the programmable delay line 436. Note that bus data signal 428 is clocked simultaneously with rising and falling edges of I/O clock signals 430 and 432. Programmable delay line 436 delays bus data signal 428, resulting in a delayed bus data signal 437.

L1_D0 data signal 452 represents the output from latch 404. Latch 404 passes the value from delayed bus signal 437 when I/O clock signal 430 is logic 1. Similarly, L2_D0 data signal 446 represents the output from latch 412. The output (L2_D0 data signal 446) from latch 412 tracks the value of delay bus data signal 437 when I/O clock signal 432 is a logic 1, and holds the value of the bus signal 437 when clock signal 432 transitions from logic 1 to logic 0, until clock signal 432 once again returns to logic 1. Latches 404 and 412 thus each capture the received input data on their corresponding clock's falling edges. Since clock 430 and 432 are complements of each other, the overall effect is that latch 404 captures data on the falling edge of clock input 426 (as logically copied to clock signal 430) while latch 412 captures data on the rising edge of clock input 426 (as logically inverted to form clock signal 432). In a similar fashion, L1_D1 data signal 454 represents the output of latch 406. L1_D1 data signal 454 tracks the output of latch 412's output, 446, when the value of I/O clock signal 430 is a logic 1 and holds the value when clock signal 430 is logic 0. L2_D1 data signal 442 is the output of latch 414 and tracks latch 404's output, 452, when I/O clock signal 432 is logic 1, and hold the value when 432 is logic 0. L1_D2 data signal 456 is the output of latch 408 and tracks the value of waveform 437 when I/O clock signal 430 is logic 1 and holds the value of bus signal 437 when clock signal 430 transitions from logic 1 to logic 0, until clock signal 430 once again returns to logic 1. L2_D2 data signal 440 is the output of latch 416 and tracks the value of latch 406 output 454 when I/O clock signal 432 is a logic 1 and holds the value when 432 is logical 0. L1_D3 data signal 450 is the output of latch 410 and tracks the value of latch 416 output 440 when I/O clock signal 430 is logic 1 and holds the value when signal 430 is logic 0. L2_D3 data signal 448 is the output of latch 422 and tracks the output of latch 408 (signal 456) when I/O clock signal 432 is logic 1 and holds the value when I/O clock signal 432 is logic 0.

As shown at point 468 in FIG. 4B, various beats from delayed bus data signal 437 are captured at various points in latching circuit 402. For example, at point 468, beat 1 is captured from L1_D3 data signal 450, beat 2 is captured from L1_D2 data signal 456, beat 3 is captured from L1_D1 data signal 454, and beat 4 is captured from L1_D0 data signal 452. Likewise, at point 466, beat 2 is captured from L2_D3 data signal 448, beat 3 is captured from L2_D2 data signal 440, beat 4 is captured from L2_D1 data signal 442, and beat 5 is captured from L2-D0 data signal 446.

As shown in FIG. 4A, MUX 462, with select input 434 and output 460, is used either to select the sampled data 452, or data sampled one bit-time earlier and delayed by one additional latch 406 (L1_D1 data signal 454), or data sampled two bit times earlier and delayed by two additional latches 414 and 408 (L1_D2 data signal 456), or data sampled three bit times earlier and delayed by three additional latches 406, 408, and 410 (L1_D3 data signal 450). Similarly, MUX 458 selects sampled and delayed data. Note that the multiplexor select inputs 434 and 418 will have, in operation, identical values such that the same amount of delay of data will occur for both MUX outputs 460 and 434. Hence, if even data beats are sampled in the first L1 sampler latch 404, odd data beats would be sampled into the first L2 sampler latch 412. Depending on whether zero, one, two, or three additional latches were added in the path into MUX outputs 460 and 434, the even data beats will appear on output 460, while the odd data beats appear on output 434, or vice-versa. Therefore, FIG. 4A shows a basic de-skewing circuit that can be employed in an elastic interface in accordance with the present invention.

Figure 5:
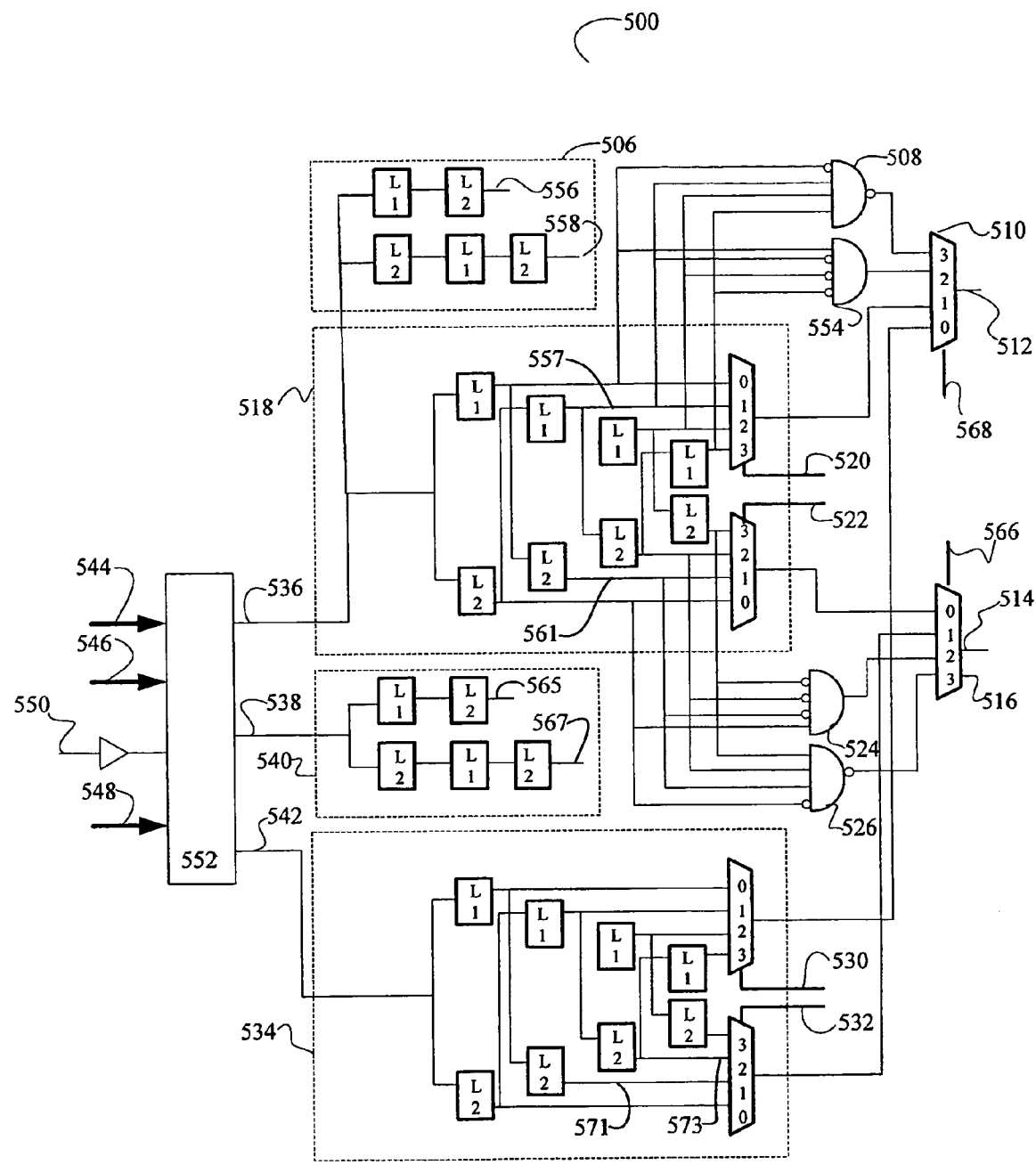
FIG. 5 is a block diagram of sampler logic for use in accordance with an embodiment of the present invention, for example, a functional data sampler, alternate data sampler, setup sampler, and hold-time sampler.

In FIG. 5, a sampler logic 500 is shown that can be used in an embodiment of the present invention. Sampler logic 500 includes a data delay line 552. Data delay line 552 has at least three delay taps. For example, data delay line 552 has functional delay tap 536, setup delay tap 538, and alternate delay tap 542. These delay taps are controlled via multi-bit signals 544, 546 and 548. Having three delay taps allows selection via control buses of different data delay values for bus data on line 550.

Figure 10:
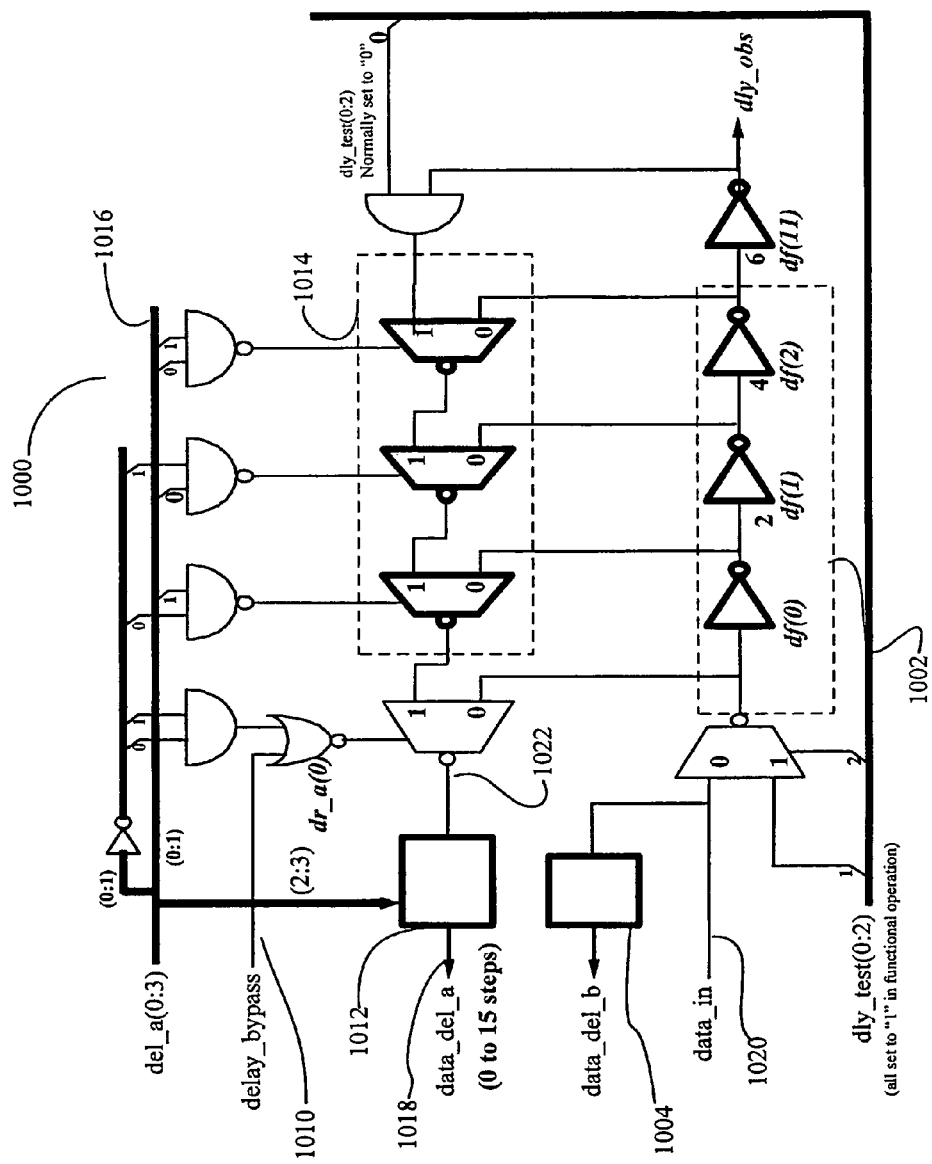
FIG. 10 is a block diagram of a clock delay line with insertion delay compensation for an I/O clock for use in an embodiment of the present invention.

Refer now to FIG. 10, clock delay line 1000 is block diagram of circuitry used for delaying clock lines in accordance with an embodiment the present invention. For example, clock delay line 1000 could be used for I/O clock signal 562 and guardband clock signal 564 (FIG. 5). Clock delay line 1000 is a simplified and truncated version of a data delay line (for example, delay line 552 from FIG. 5, also delay line 1400 in FIG. 14). The signal in need of delay is input to line 1020. The input signal is then fed through coarse delay element 1002 and on to fine delay element 1012. The four delay elements (shown as four inverters) within coarse delay element 1002 provide four levels of delay. The signal in need of delay is input into line 1020. The input signal is then fed through a course delay element consisting of inverters and inverting multiplexors shown in blocks 1002 and 1014. Each inverter or inverting multiplexor shown in blocks 1002 and 1014 will add two steps of delay in the path from signal 1020 to signal 1022, which is input to block 1012. The number of these course delay inverters or multiplexors in the path is controlled by the most=significant two bits of the delay controls inputs 1016, del_a(0:1). As can be seen either zero, two, four, or six of these inverters or multiplexors can be included in the path, giving either 0, 4, 8, or 12 steps of delay from data_in signal 1020 to signal 1022. Fine delay element 1012 provides four selectable unit steps of delay, 0, 1, 2 or 3, as controlled by the least-significant two bits of the delay control input 1016, del_a(2:3). Thus, with the combination of the course delay elements of blocks 1002 and block 1014, and the fine delay element 1018, 0 to 15 delay steps can be added in the path from input 1020 to output 1018, as controlled by the four-bit control input 1016.

In addition to primary delayed output 1018, there is a second delay tap output 1004. This output has only the "insertion delay" portion of the delay line. All delay lines, as with any logic function, have delay associated with them even though the "specified delay value" is zero. This insertion delay can be sizeable for some technologies and implementations, and therefore should be compensated for. In the case of the I/O clock (for example, item 562 from FIG. 6) and the guardband clock (for example, item 564 from FIG. 6), if the clock delay line were used to delay the I/O clock, this delay (with respect to the I/O clock) would be both the desired delay value plus the insertion delay. Since there is normally a need for a precise "guardband-only" separation between the I/O clock (used to sample the functional and setup-delayed data points) and guardband I/O clock (used to sample the hold-time data point), this insertion delay must be accounted for. This can be done using the second delay tap output 1004 as the source for the sample clocks for the functional and setup latches. With this compensating insertion delay placed in the I/O clock's path, the difference between the I/O clocks and the guardband clocks is just the guardband delay value.

Referring now to FIG. 14, delay line 1400 depicts a circuit for delaying a bus bit in accordance with the embodiment of the present invention. Delay line 1400 could be used for the data delay line 552 from FIG. 5. Delay line 1400 delays data bits, and is similar to the clock delay line 100 (FIG. 10), which delays clock signals. The data bit to be delayed is input on data_in line 1422. Three separate six-bit wide delay control inputs del_a(0:5), (labeled 1426, del_b(0:5) (labeled 1432), and del_c(0:5) (labeled 1434) are used to independently control the amount of delay from data input 1422 to delayed data outputs 1420, 1416, and 1414, respectively. As with the clock delay line shown in FIG. 10, the delay function consists of course delay elements implemented with the eleven inverters shown in Block 1406 along with separate blocks of inverting multiplexors in blocks 1424, 1428, and 1430. The most-significant four bits of each of the control buses 1426, 1432, and 1434 control the amount of delays the respective delay outputs, and 0 to 44 steps of delay in 4-step increments. The least-significant two bits of each of these control buses, controlling the fine delay elements 1408, 1410, and 1412, respectively, add an additional 0 to 3 delay steps, in one-step increments. The net effect is that the data input 1422 can be independently delayed via the three control buses 1426, 1432, and 1434, such that the delayed data outputs 1420, 1416, and 1414, can each have 0 to 47 unit steps of delay. Therefore delay line 1400 is an example of a three-tap, 48-step programmable delay line for the use in an embodiment of the present invention.

Figure 6:
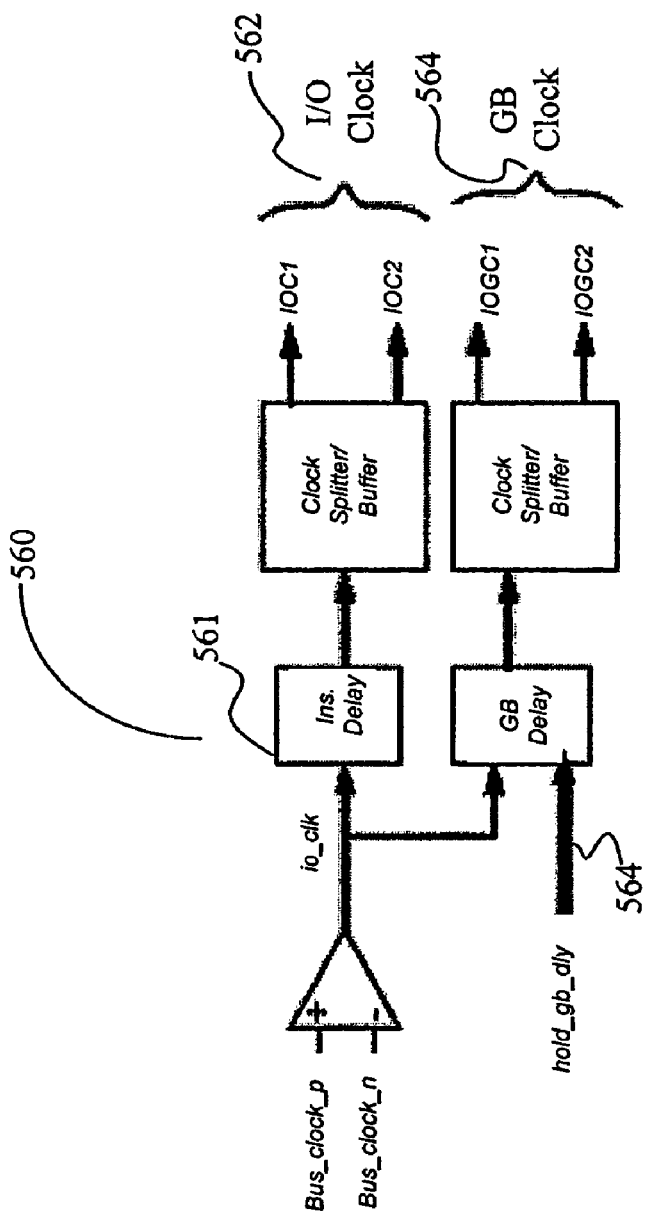
FIG. 6 is a block diagram of an example source of the I/O clock and guardband (GB) clock associated with FIG. 5.

Referring now to FIG. 6, clock set 560 represents a clock delay line used to generate a normal clock (I/O clock) signal 562 and a guardband (GB) delayed clock signal 564. Each clock signal 562 and 564 represents a clock signal and its complement. The purpose of this circuit is to generate the normal sampling clock signal 562 and a clock signal that is one "guardband" delay later, GB clock signal 564. Since this later (guardband) clock is created using a variable delay line (refer to FIG. 10), and the delay line will inherently have an "insertion delay" (a fixed amount of delay even when the variable delay is set to its minimum), an equivalent insertion delay is placed in the path to generate the I/O clock. Thus, though both the I/O clock 562 signal and the GB clock signal 564 have an identical fixed amount of insertion delay added to them, the GB clock signal 564 will be a variable amount later, as determined by the value of the hold_gb_dly signal input to line 564 (FIG. 6). The ins_delay block 561 and GB_delay block 564 may be implemented using the clock delay line 1000 (FIG. 10), wherein the I/O clock is generated via output 1004 and the GB clock is generated by output 1018.

Circuitry 534 and circuitry 518 each represent basic de-skewing delay line and delay latch schemes as shown in FIG. 4A. Circuitry 518 represents a "functional sampler." In an embodiment of the present invention, functional sampler 518 uses identical logic as functional sampler 402 from FIG. 4A. Functional sampler uses functional delay tap 536 as an input. Functional latch delay signal 520 controls the output of the multiplexor receiving L1 latch signals from within functional sampler 518. Functional latch delay signal 522 controls the output of the multiplexor receiving L2 latch signals from within functional sampler 518. Output signal 557 from the L1 latch in functional sampler 518 is shown by signal 557 in FIG. 7.

Circuitry 534 represents an "alternate sampler." In an embodiment of the present invention, alternate sampler 534 uses identical logic as functional sampler 402 from FIG. 4A. Alternate sampler 534 uses alternate delay tap 542 as an input. Alternate latch delay signal 530 controls the output of the multiplexor that receives the outputs from L1 latches from within alternate sampler 534. Similarly, alternate latch delay signal 532 controls the output of the multiplexor that receives the outputs from L2 latches from within alternate sampler 534.

Circuitry 540 represents a "setup sampler." Setup sampler uses a rising edge and falling edge sampling latch structure to latch data from the setup delay tap 538 of delay line 552 (using the I/O clock 562 in FIG. 6). In operation, the setup delay input is larger than the functional delay by a "guardband" value. Output 567 from setup sampler 540 corresponds to signal 567 in FIG. 7. Likewise, output signal 565 from setup sampler 540 corresponds to signal 565 in FIG. 7.

Circuitry 506 represents a "hold-time sampler." Hold-time sampler 506 uses a rising edge and falling edge sampling latch structure to latch data from the functional delay tap 536 of the delay line. Hold-time sampler 506 uses the guardband delayed I/O clock signal 564 (FIG. 6) to sample the functional data later than functional sampler 518. Output signal 558 (FIG. 5) is shown as signal 558 in FIG. 7. Output signal 556 (FIG. 5) is shown as signal 556 in FIG. 7.

Element 508 and element 554 represent additional combinatorial logic (logic AND functions) used to detect the first beat of data in an interface alignment pattern (IAP sequence). Multiplexer 510 is used to select from among the outputs of functional sampler 518, alternate sampler 528, or outputs of the AND functions described above. Multiplexor output 512 outputs de-skewed bits from L1 latches from functional sampler 518 and alternate sampler 528. Multiplexor output 514 outputs de-skewed bits from L2 latches in functional sampler 518 and alternate sampler 528.

Figure 7:
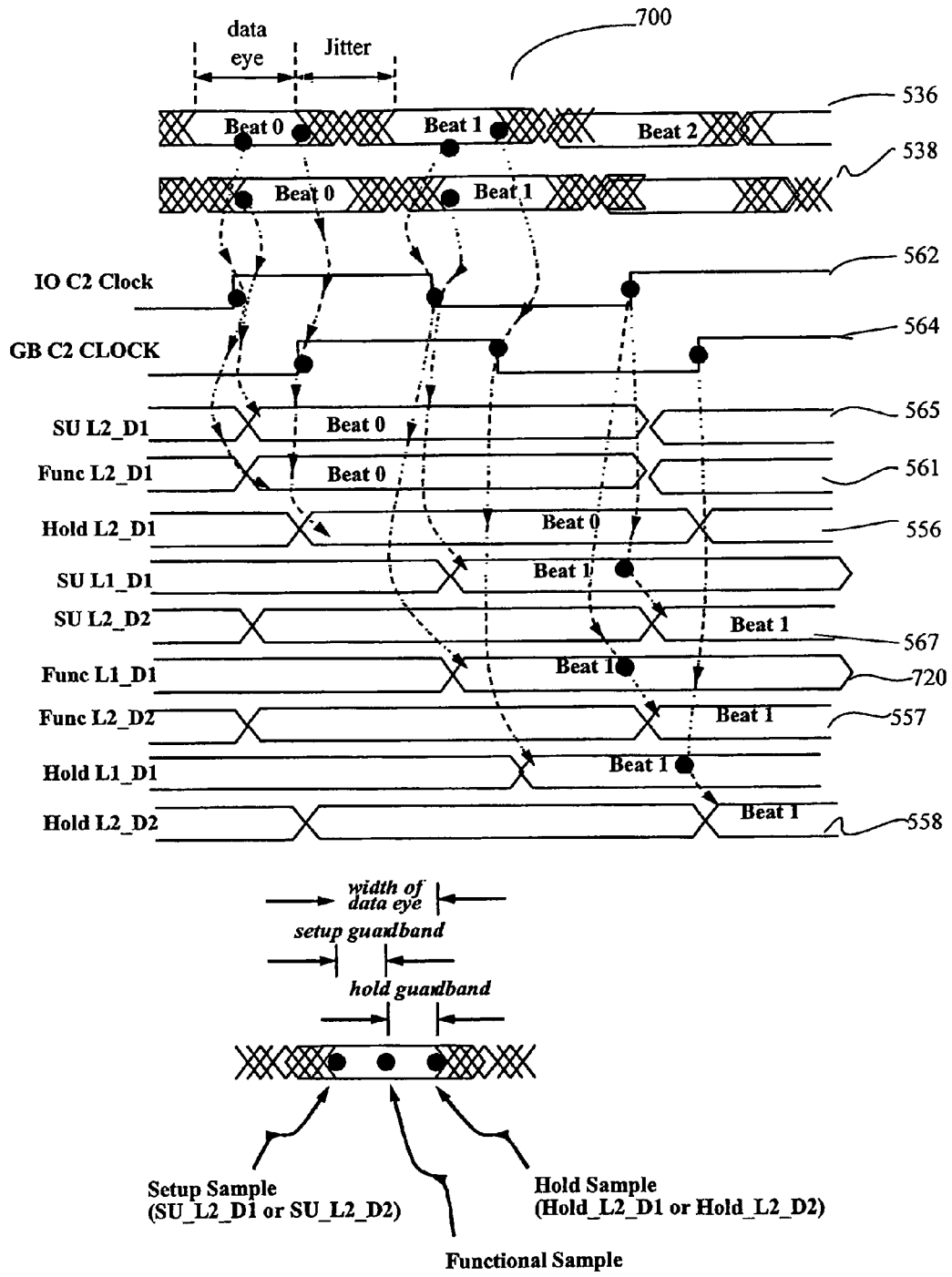
FIG. 7 is a timing diagram showing waveforms during the guardband detection operation in accordance with an embodiment of the present invention.
Figure 8:
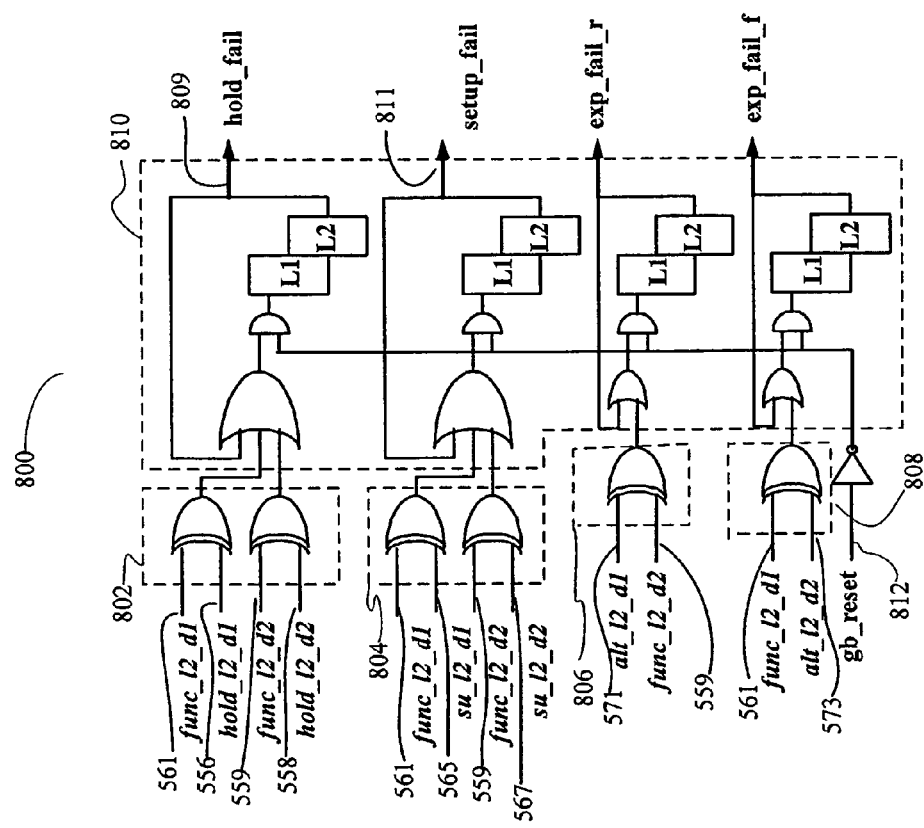
FIG. 8 is a block diagram of guardband fail capture logic.
Figure 9:
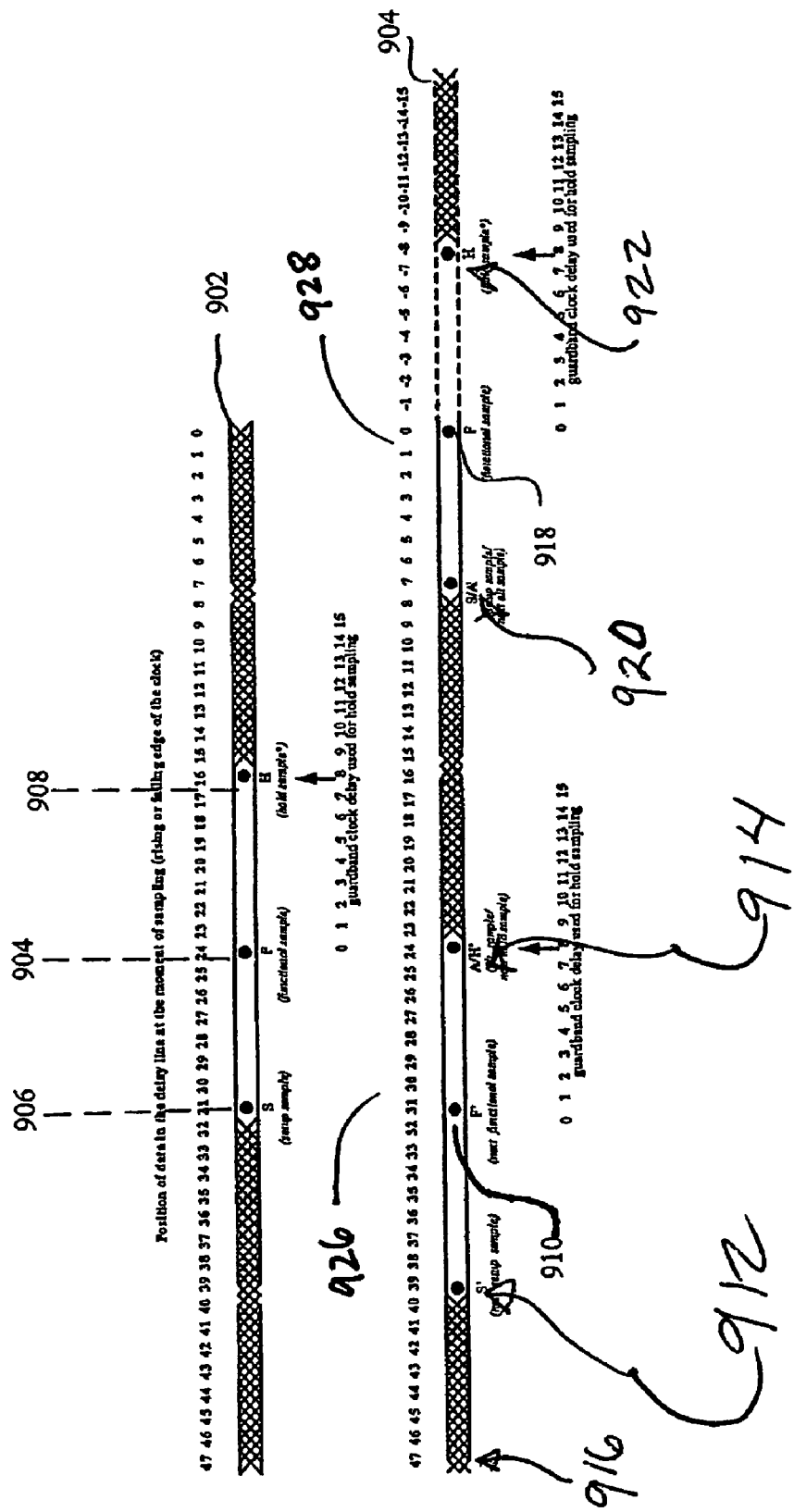
FIG. 9 is a timing diagram showing sample points over many clock cycles of sampling performed in accordance with an embodiment of the present invention.

Refer now to FIGS. 7, 8 and 9. FIG. 7 shows waveforms and associated sampling points used to achieve optimal sampling as shown in FIG. 9. FIG. 9 shows the result of accumulating data in the delay line by running a de-skewing algorithm in accordance with an embodiment of the present invention. When selecting a tap point on the delay line for sampling the data, there is generally a goal to select the tap point along the delay line to optimally meet many criteria. First, for example, the sampling point should be centered on the data eye. This assures the sampling point is as far as possible from the "noisy" edges of the data eye and therefore is less likely to sample data incorrectly when an unusual noise event occurs. Second, if more than one data eye can be sampled with the delay line, the widest data eye should be selected. This assures maximum sampling distance from any potential noise event on the bus. Third, if more than one data eye can be sampled with the delay line, and if each data eye is of roughly the same size, the smaller (earlier) sample point should be used. This minimizes the latency of data on the bus. The later sample, if used, would add one bit time of latency in capturing data off the bus. Fourth, the sampling point should be selected in order to delay the data to the closest clock data edge, if that results in sampling in the largest data eye. This is because elastic interface drivers often launch even data beats coincident with rising I/O clock edges and odd data beats on falling I/O clock edges (normal DDR bus operation) and differences in clock and data paths in chip, module, board, and connector wiring might cause the "launching" clock edge for a given beat of data to either lead or lag the arrival of the actual data by multiple bit times/clock edges. Therefore, by de-skewing the data so that it is delayed only to the closest clock edge, the amount of delay needed will at most be one bit time. This provides the advantage of a shorter delay line, which improves noise performance and lessens susceptibility to variations due to process, temperature, etc., inherent in long silicon-based paths. Furthermore, smaller delay lines require less silicon area on a chip. FIG. 7 shows waveforms of signals applied to the logic circuit 800 (FIG. 8) in accordance with an embodiment of the present invention. Like-numbered elements among FIGS. 5, 6, 7, and 8 correspond. Logic circuit 800 (FIG. 8) is used to compare a functional sample point with two "guardband" sample points, which are sampled earlier and later in the valid data window. These three sample points, when compared using the logic circuit 800, allow the alignment mechanism to detect whether a functional sample point is "centered" in the data eye and adjust the functional sample point (by selectively delaying the data with respect to the sampling clock) if a setup or hold fail occurs. The "guardband" distance from the functional sample point can also be adjusted such that the setup and hold guardband latches always sample close to the edge of the data eye.

In FIG. 7, signal 536 is from the functional data delay tap 536 in FIG. 5. Signal 538 in FIG. 7 corresponds to setup delay tap output 538 from FIG. 5. A "functional sample" is obtained by sampling waveform 536 on rising and falling edges of I/O clock signal 562 (from FIG. 6). A "hold sample" is obtained by sampling functional data delay tap 536 using guardband delayed clock signal 564 (from FIG. 6). A "setup sample" is obtained from sampling signals 538 on rising and falling edges of I/O clock signal 562.

In FIG. 7, if all three samples are equal, the functional and guardband sample points are all in the data window. However, if there is a mis-compare between the setup and functional sample points, a setup guardband fail occurs. If there is a mis-compare between the hold and functional sample points, a hold-time guardband fail occurs.

Referring now to FIGS. 5 and 8, logic circuit 800 comprises data comparators (exclusive-OR gates) 802, 804, 806, and 808 along with a "sticky" latching logic 810 which captures any instance of functional and guardband sample point mismatch over an accumulation period. Logic circuit 800 is used to determine whether sampling is occurring properly within the data eye. A signal from the control logic (GB_reset) 812 can then be asserted and negated to reset the sticky guardband latches after any delay step adjustment is made and before accumulating new guardband fails. Signal 573 (FIG. 5) is fed to comparator 808. Input 561 (FIG. 8) is coupled to output 561 (FIG. 5) from an L2 latch in the functional sampler 518 (FIG. 5). Note that input 561 is fed to exclusive-OR (XOR) gates in data comparator 804 (FIG. 8), data comparator 808 (FIG. 8), and data comparator 802 (FIG. 8). Input 556 (FIG. 8) is coupled to output 556 (FIG. 5) from the L2 latch in hold-time sampler 506 (FIG. 5). Input 559 (FIG. 8) is coupled to output 559 (FIG. 5) from an L2 latch in the functional sampler 518 (FIG. 5). Note that input 559 (FIG. 8) is coupled to exclusive-OR (XOR) gates in data comparator 802 (FIG. 8), data comparator 804 (FIG. 8), and data comparator 806 (FIG. 8). Input 565 (FIG. 8) is coupled to output 565 (FIG. 5) from an L2 latch in alternate sampler 540 (FIG. 5). Input 567 (FIG. 8) is coupled to output 567 (FIG. 5) from the L2 latch in setup sampler 540 (FIG. 5). Input 573 (FIG. 8) is coupled to output 573 (FIG. 5) from the L2 latch in alternate sampler 528 (FIG. 5). The output signals for logic circuit 800 are fed to the control logic used for optimizing the sampling of data bits. The sampling of data bits is described further in methodology 1300 shown in FIG. 13.

Refer now to FIG. 9. FIG. 9 shows graphically how two adjacent beats of data might appear along a delay line (such as delay line 552, FIG. 5) at the moment the data is sampled (i.e., on either a rising or falling clock edge.) FIG. 9 shows three samples taken within a data eye for data bit 902. Data bit 902, as shown, represents an overlay of several data beats for a data bit 902. As shown, data bit 902 has distortion and jitter that should be avoided when sampling. For data bit 902, the sample points occur at points 906, 904, and 908. When determining optimal sample points, the goals can be summarized as having one sample point in the middle of the data eye and a sample on either side of the data eye as close to the rising and falling edges as possible.

FIG. 9 shows an example using a 48-step data delay line (for example, data delay line 1400 shown in FIG. 14) and an associated 16-step hold-time clock delay line (for example, clock delay 1000 shown in FIG. 10). Waveform 902 illustrates a single data "eye" that would optimally be sampled at the delay position "24" shown at point 904. The single data eye is centered at point 904 and extends roughly from delay position "16" shown at point 908 to delay position "31" shown at point 906. If the guard-band delay value is set to 8, as shown in item 910, then the setup delay value, at position "31," will be on one edge of the data eye, and the hold-time delay, which is sampled by delaying the clock by 8 delay steps, effectively samples the data eye at the data delay time of position "16" at point 908, which is at the other edge of the data eye.

As shown by waveform 904 in FIG. 9, there also may be two (or more) data eyes within a delay line at any moment. The two data eyes shown in waveform 904 represent two adjacent data beats on the bus and are present in the delay line at the moment of sampling. The first beat of data is shown centered at data delay position "31" (item 910). The second beat of data is shown centered at data delay position "0" (point 918). Waveform 904 illustrates that the first beat of data, if sampled using tap "31" (point 910), has been delayed by an entire bit time. That same beat of data could have been sampled one bit time earlier on position "0" (point 918) by sampling one clock edge earlier. Thus, if the data were sampled on a rising clock edge # N using tap position "31" (point 910), it could also be sampled on falling clock edge N−1, using tap position "0," one bit time (31 delay positions) earlier.

As discussed above, de-skewing each data bit to the closest clock edge only partially completes the data de-skew process in many cases. As shown in FIG. 3D, different data bits (for example, signal 332 and signal 334 from FIG. 3D) in an elastic bus could be de-skewed to different clock edges than those which launched the data. Thus, as shown in FIG. 3D, some data bits, after de-skew to the closest clock edge, might have beat 0 latched one or more bit times earlier or later than other bits in the clock/data group latch beat 0 (for example signal 332 in FIG. 3D). As shown in FIG. 3D, the earlier data bit (signal 332) needs to be delayed by two bit times (resulting in signal 338, FIG. 3D) such that all beats of a clock/data group are aligned. Therefore, for aligning the bits, it is necessary to keep track of which beat of data is received at a given instant for each bit in a clock/data group.

The first task in lining up all the beats of data is to be able to identify or differentiate "beat N" of the data. Some systems identify "beat N," in part, by sending a very simple IAP training pattern (interface alignment pattern) which consists of a single '1' followed by $2^n-1$ '0's. In many systems, the repeating IAP pattern consists of either a single '1' and seven '0's, or a '1' and fifteen '0's. In such systems, it is therefore easy to detect the '1' as the first beat of the IAP pattern and align all bits to the same beat cycle. However, for elastic interface designs that operate at considerably higher data rates, very precise alignment of each bit on the bus is desirable because noise margins are critical. In order to read the IAP pattern, the signal can be fed into a FIFO for processing. The depth of the FIFO affects the length of patterns that can be recognized. An IAP training pattern can have a repeating multi-beat pattern consisting of a single '1' followed by a number N '0's, where N is a function of the receivers FIFO depth. For example, in embodiments of the present invention, a FIFO may be four, eight, or more bits deep.

For many elastic interfaces, such training patterns are used to align (de-skew) the interface and to estimate the driver-to-receiver latency (also commonly referred to as the "target time" or "target cycle"). This method of sending training patterns, in its simplicity, has some disadvantages. First, many IAP patterns have very few data transitions. Second, because there is only a single '1' in a field of '0's, there is the potential for some distortion that can cause narrowing of the lone pulsed '1' due to various circuit and transmission line related effects. A more desirable IAP pattern for high-speed elastic interface communication is "busy" and has more than one pulse. Such a busy IAP pattern can be any pattern that creates a large number of 0-to-1 and 1-to-0 transitions. Such IAP patterns give a more realistic (more like real bus data) than the "1 and $2^n-1$ '0's" patterns. Therefore, the use of busy IAP patterns aids the process of de-skewing to a closest clock edge.

In an embodiment of the present invention, the busy IAP pattern 1100 in FIG. 11 is used. IAP pattern 1100 is 64 bit times long, (numbered 0 through 63), and has a known, repeating sequence. In addition, IAP pattern 1100 has a large number of 0-to-1 and 1-to-0 transitions. Further, IAP pattern 1100 has only one occurrence of three consecutive zeros followed by a one (beats 61, 62, 63, and 0, as underlined in IAP pattern 1100). This four-beat sequence of "0001" can be detected using the sampling/delay logic shown in FIGS. 4A and 5, for example. Referring to FIG. 5, for example, this detection of the 4-beat sequence is accomplished with the AND functions implemented by items 508, 554, 524, and 526 (FIG. 5). The two different AND functions detect either a "0001" sequence or, if the bit is inverted at the driver, a "1110" sequence, the last beat of which will correspond to the first beat (beat "0") of the 64-beat IAP sequence. By selecting input "2" or "3" of the final multiplexors shown as items 510 and 516 (FIG. 5), the busy IAP pattern 1100 is converted into a simple (1 and 63 zeroes) pattern similar to "1 and $2^n-1$ '0's" used in other elastic interface designs. This methodology thereby creates an easily detected reference beat of data once in every 64 beats of data. The converted, busy IAP pattern is commonly referred to as a "modified IAP pattern." In an embodiment of the present invention, this modified IAP pattern has a single '1 followed by sixty-three '0's.

During the alignment process, a very "busy" repeating data pattern is sent over the bus. This pattern has data transitions which occur very often, with instances of data changing from 0 to 1 (or 1 to 0) every bit time, every two bit times, and every three bit times. Thus, over a short period of time (20 to 30 bit times), several instances of data changing from 1 to 0 or 0 to 1 will occur between any three adjacent data beats on the bus. Thus the data eyes, as shown in FIG. 9, along with the "noise" or fuzzy area between adjacent eyes will occur over a long sampling/guardband error accumulation period.

Figure 12A:
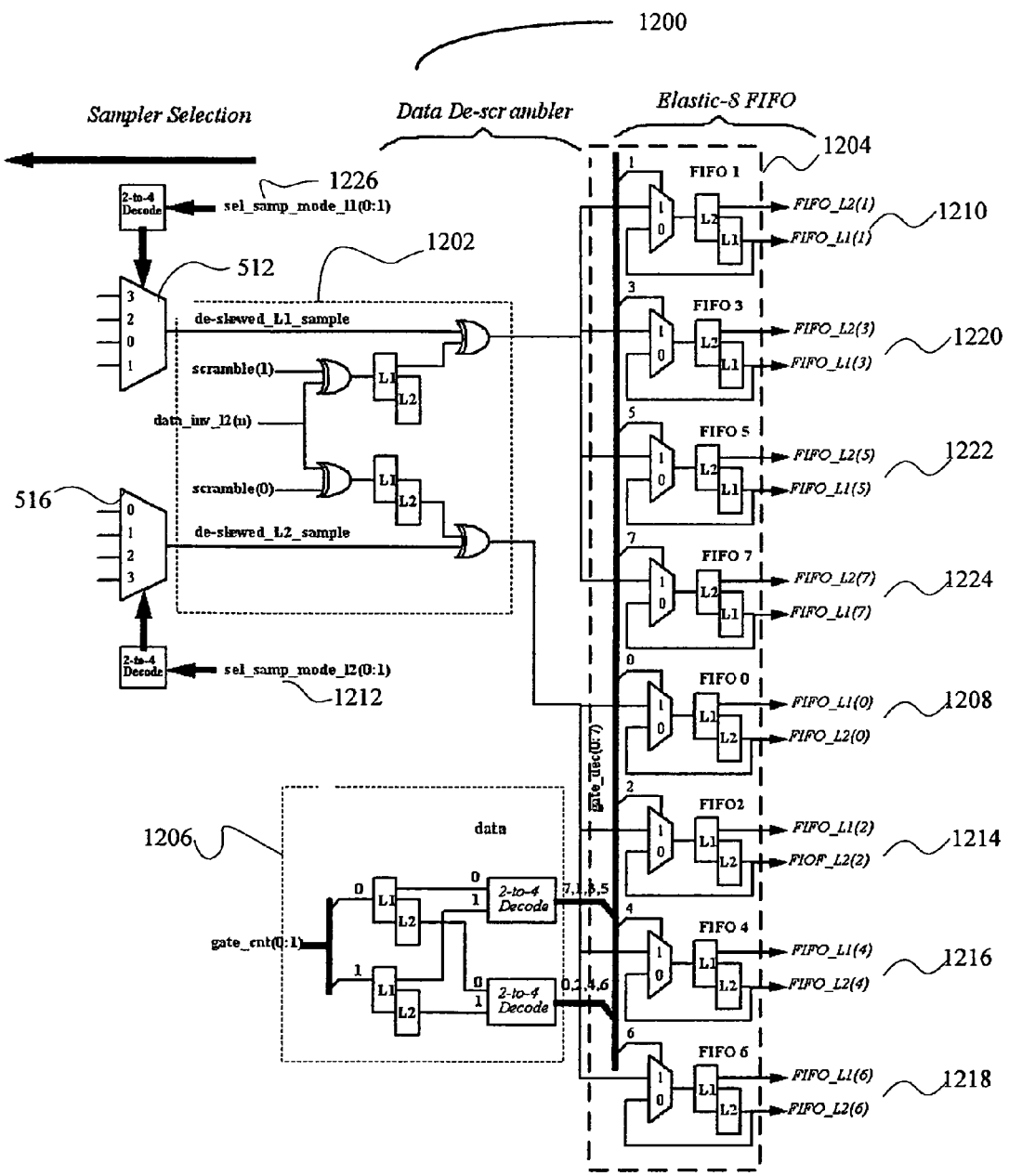
FIG. 12A is a block diagram of FIFO (first in first out) input logic that loads sampled and de-skewed data into FIFO latches in accordance with an embodiment of the present invention.

Referring to FIG. 12A, circuitry 1200 shows example FIFO circuitry used for processing an IAP training pattern in accordance with an embodiment of the present invention. Circuitry 1200 represents an "elastic 8" FIFO because the FIFO is 8 bits deep. Multiplexors 512 and 516 correspond to the like-numbered multiplexors in FIG. 5. In an embodiment of the present invention, circuitry 1200 also has "de-scrambling" logic shown as item 1202. This descrambling logic 1202 selectively inverts the sampled data before it is loaded into the eight FIFO latches. The eight FIFO latches are shown as item 1204 and consist of four L2-L1 latches and four L1-L2 latches which accompany the two sample/hold multiplexors 512 and 516.

Multiplexors shown in FIFO 1204 are controlled with a two-bit "gate counter" 1206 which supplies eight different phases of sample/hold signals to the L2-L1 and L1-L2 latches shown in FIFO 1204. The combination of gate counter 1206 and the sample/hold muxes allows the de-skewed L2 samples to be loaded into the even (0, 2, 4, and 6) FIFO latches, while the de-skewed L1 samples are loaded into the odd (1, 3, 5 and 7) FIFO latches, with the net effect of having sequential data beats loaded sequentially into FIFO latch 0, 1, 2, 3, 4, 5, 6, 7, and then back to 0. Thus, each beat of data is loaded into a FIFO latch, remaining there for the eight bit times (for an eight-deep FIFO) until it is written over by the next data beat. Thus FIFO latch 0 (shown as item 1208) will be loaded with data beat N, then, eight bit times later, by data beat N+8, while FIFO latch 1 (shown as item 1210) will be loaded with data beats N+1, N+9, etc. The modified IAP pattern, consisting of a single '1' and 63 '0's, when loaded into FIFO 1204, will repeatedly load the first beat of the pattern (the '1') into one of the FIFO latches, where it will remain for eight bit times. It will then be overwritten with '0's every eight bit times for the next 56 bit times, until the subsequent '1' of the repeating IAP pattern once again is loaded into that FIFO register. All other FIFO registers will be constantly reloaded with the '0's of the modified IAP pattern.

Gate counter 1206, which is used to load data into the FIFO latches in the I/O clock domain, is normally a free-running counter incremented in the I/O clock domain, and is shared across all the bits in a clock/data group. Thus all the de-skewed L1 and L2 sample data for a clock/data group are loaded into the same FIFO latch number (for example, FIFO latch 0, 1, etc., shown as items 1208 and 1210). This gate counter 1206 can be further "incremented" beyond its normal free-running count by incrementing by two instead of one for one cycle, or it can be "decremented" from its normal free-running count by not incrementing for one cycle.

Similarly, the local select counter, used to unload the FIFO into the local clock domain, is normally a free-running counter which is incremented every local clock cycle and is shared across all bits in the clock data group. Logic after this free-running counter can be used to selectively force the local select multiplexor to statically select one of the FIFO latches as input to the local latch, allowing the sticky one-detector to constantly look at the contents of a selected FIFO latch.

Therefore, the de-skewed L1 and L2 sample data must be the same data beat when loaded to and later unloaded from the FIFO latches (shown in FIFO 1204). Note further that, due to the limitations of the number of functional sampler latches, a maximum allowable skew is fixed between the earliest and latest bits (de-skewed to the closest clock edge) within a clock/data group. For the examples and embodiments discussed herein, the maximum skew between the earliest and latest bits can be three bit times. However, the examples discussed herein are not meant to limit the subject matter, as the present invention and principles of the present invention can be practiced with a greater number of functional sampler latches and associated hardware. Thus, more (or different) circuitry and logic can be implemented to allow bits with skew times of more than three bit times to be successfully de-skewed and aligned in accordance with the principles of the present invention.

Figure 12B:
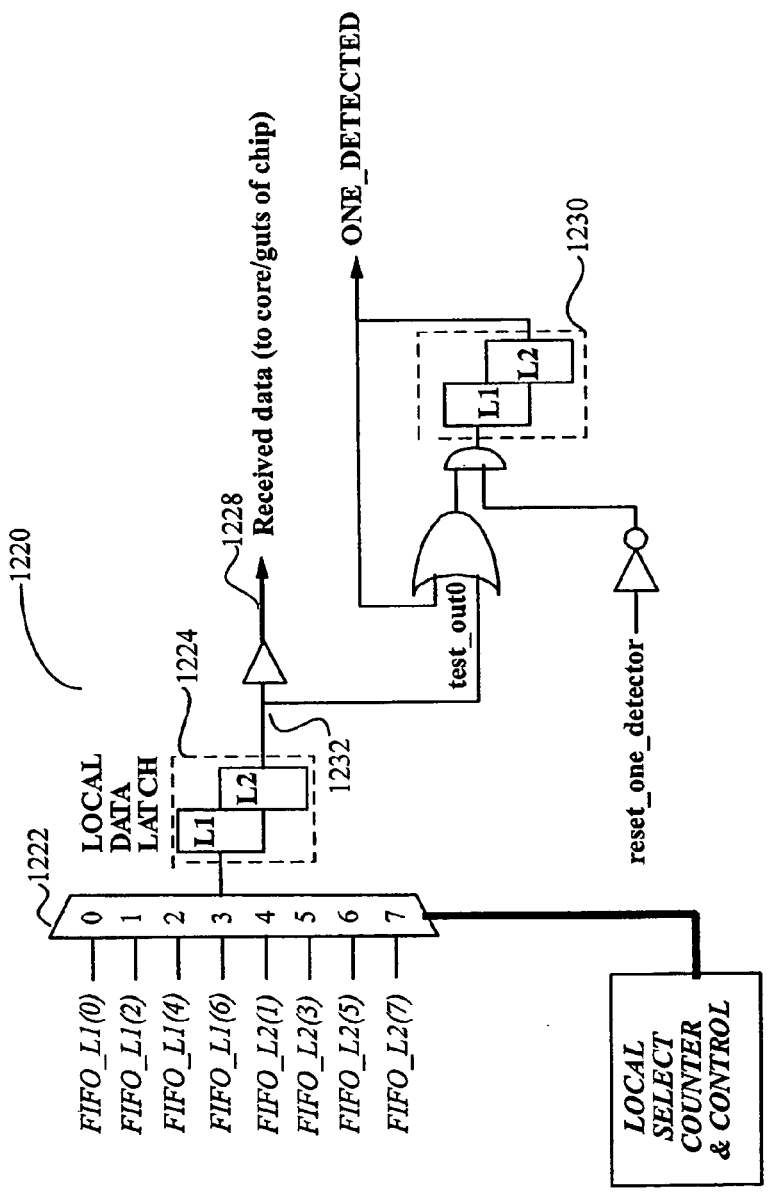
FIG. 12B is a block diagram of representative FIFO output logic for an embodiment of the present invention.

Referring to FIG. 12B, circuitry 1220 shows one example of FIFO output logic and associated local data latch for use in an embodiment of the present invention. This implementation consists of an 8-to-1 multiplexor (item 1222, used for the the eight-deep FIFO shown as item 1204 from FIG. 12A) to select one of the FIFO latch outputs (from item 1204, FIG. 12A) and load it into a latch (item 1224) which is clocked in the chips internal ("local") clock domain (as opposed to the received "I/O" clock domain). In this embodiment, the local clock is running at twice the speed of the I/O clock, such that a full local clock period occurs every bit time on the bus. For functional data, the output (item 1232) of this local latch is therefore the received data which will be forwarded to the guts of the receiving chip at point 1228. During alignment, this local latch data is also input to a "sticky" latch (item 1230) which can detect if a '1' of the modified IAP pattern has occurred on the selected FIFO latched that is gated to this local data latch. The output of latch 1230 is observed by the control logic in the alignment algorithm to determine when the first beat of the modified IAP pattern has been loaded into the correct FIFO latch.

Figure 13:
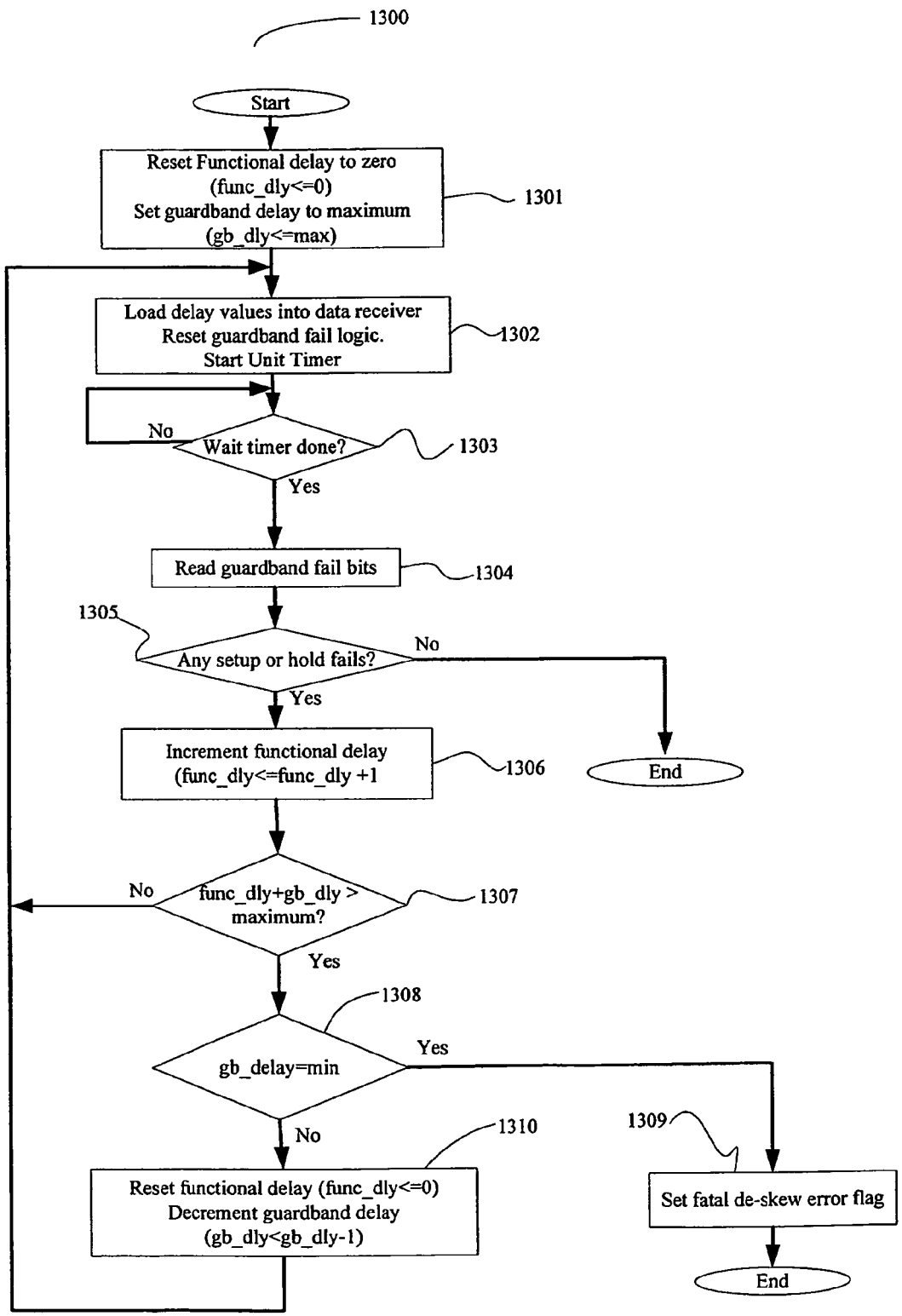
FIG. 13 is a flow diagram representing a de-skew algorithm practiced in accordance with an embodiment of the present invention.

Referring now to FIG. 13, methodology 1300 illustrates representative steps taken by an embodiment of the present invention to de-skew a single bit to the closest clock edge. In step 1301, a counter for the functional delay (func_dly) is reset to zero. Also, a counter for the guardband delay (gb_dly) is set to its maximum value (in the illustrations, this is 15 delay steps). This sets the functional data sampling point to its minimum delay value of zero. The setup delay is set to the sum of the functional and guardband delay values (0+15=15, in this case). By way of example, as illustrated in FIG. 9, the functional sample occurs at point 904 for data bit 902. The guardband clock delayed signal is for determining the location of the hold sample. Initially, the hold-time guardband delay is set to the guardband value. The hold-time guardband delay serves to delay the clock signal with respect to the functional delayed data. Delaying the clock signal with respect to the functional delayed data effectively allows for sampling the functional data 15 delay steps before the functional sample point, at a delay value (with respect to the data) of negative 15.

The initial sampling points represent starting values wherein an embodiment looks for the widest possible data eye while adding the minimum amount of delay to the data path. In step 1302, these counter values are loaded into the data bit's data and guardband clock delay registers. The guardband error capture logic are reset, clearing out any fails from guardband errors set using other delay/guardband values. The guardband error capture logic consists of "sticky" latches (for example, as shown in FIG. 8) that store any instance of guardband errors (mis-compares between the functional, setup, and hold-time sample points) over a long sampling interval. A wait timer is then started. In step 1303, the wait timer allows guardband fails to accumulate over a reasonable number of bit times (typically several hundred bit times). In step 1304, the setup and hold-time fails are read from the sticky guardband fail logic registers. Referring to FIG. 8, a hold-time fail could be detected at output 809. Likewise, a setup fail could be detected at output 811. In step 1305, if there or no setup or hold-time fails, this indicates that, for the selected data eye size (two times the width of the guardband delay value), and the selected functional delay value, that the setup, functional, and hold-time samples are always equal for all the data beats during the guardband fail accumulation period. As shown in FIG. 9, the setup, functional, and hold-time samples are equal when the sample points 906, 904, and 908 yield the same value for data bit 902.

Therefore, adjusting the functional delay (func_dly) and guardband delay (gb_dly) values results in centering the sample point in the widest and earliest available data eye, and the process ends sucessfully. If, however, either a setup or hold-time fail (or both) occur during the fail accumulation "wait" period, it indicates that either the functional, setup, or hold-time sample points are not properly positioned within the data eye. Referring to the data bit 902 in FIG. 9, a setup fail would occur if point 906 occurred outside the data eye, to the left of its current position as shown. Likewise, a hold-time fail would occur for data bit 902 if point 908 occurred outside the data eye, to the right of its current position as shown. If either such setup failure occurs, the process continues to step 1306.

In step 1306, with the previous functional and guardband delay values, the guardband checking produced one or more fails. Therefore, the functional delay counter is incremented (while keeping the guardband delay value at its previous value). This effectively moves the three sampling points (setup, functional, and effective hold-time sample points) up by one delay step, such that a search for the same width of data eye can occur further down the delay line (later in time by one delay step value). In step 1307, the setup delay point is limited to the length of the data delay line, and since the functional delay line is one guardband delay less that the setup delay point (setup_dly=func_dly+gb_dly), if the new functional delay value plus guardband is less than the delay line length, that new functional delay value can be checked by going back to step 1302 for guardband checking. If, however, this setup delay point is greater than the maximum value of the delay line (greater than 47 for the example shown in FIG. 9), then it can be concluded that, for the given guardband delay, there is no functional delay value for which a data eye can be found along the delay line which is less than 2 times the guardband delay wide, and the process continues to step 1308. In step 1308, the guardband delay, (gb_dly), represents, in delay increments, one-half the width of the data eye. If this data eye is smaller than a pre-determined minimally acceptable value (2×"min" or 1×gb_dly), it indicates that the data is too noisy for acceptable data transfer, and the process goes to step 1309. If, however, this data eye is not below the acceptable minimum, the process continues to step 1310. In step 1309, if the data eye is too small for reliable operation, a de-skew error is posted to the system control logic and the process ends with an alignment failure. The process arrives at step 1310 when, for a given guardband delay value (given data eye size), there is no functional delay value across the delay line for which a data eye can be found. In step 1310, the functional delay value is reset to its initial value of 0, and the guardband delay decremented by one, with the searching process then continuing at step 1302.

Methodology 1300 shows that, to optimize sampling, the process searches for a larger data eye than actually exists. Therefore, the process then decrements the guardband delay (thereby looking for the next-smallest possible data eye) and resets the functional delay value to zero (thereby looking for the smallest functional sample point using that smaller data eye search criteria). These new values are then used in a new search starting back at step 1302. In summary, the algorithm 1300 for de-skewing data to the closest clock edge, as described above, selects an optimal sample point while using a minimal amount of silicon delay and associated noise/variability disadvantages.

Referring back to FIG. 12A, other representative steps of an embodied method are described for completing the de-skew by adding sampling latches. First, the sel_samp_mode MUX controls, shown as items 1212 and 1226, are set to select the AND function outputs, which thereby gates the "one '1' and sixty-three '0's" alignment pattern into the FIFO input logic. Note that for each bit, this '1' of the IAP pattern has been de-skewed to the closest clock edge, but the '1' is from the first sample latch and thus has not had any additional bit times of de-skew added. Second, this '1' of the IAP pattern will be loaded into one of the FIFO latches, as determined by the gate count at the time that bits '1' of the modified IAP pattern is on the de-skewed L1 or L2 sample. If that '1' for a bit has been de-skewed to be captured on the rising edge of the I/O clock, it will be on the de-skewed L2 sample and therefore loaded into one of the "even" FIFO latches, shown as items 1208, 1214, 1216, and 1218. Similarly, if that '1' for a bit has been de-skewed to be captured on a falling edge of the I/O clock, it will be on the de-skewed L1 sample and therefore be loaded into one of the "odd" FIFO latches, shown as items 1210, 1220, 1222, and 1224. Third, since the skew between the de-skewed-to-closest-clock-edge data must be no more that three bit times (in this example, which is the skew limitation defined for the bus in this elastic interface implementation) apart across an entire clock/data group, the '1' of the IAP pattern will be loaded, at worst, into four adjacent latch of the FIFO. For instance, the earliest data bit might arrive at the FIFO inputs when the gate counter is selecting FIFO 2 (shown as item 1214) to be loaded (from de-skewed L2 sample), and thus will be loaded there, while the latest bit on the bus might be sampled three bit times later and be loaded into the FIFO when the gate counter is selected FIFO 5 (shown as item 1222) to be loaded (from the de-skewed L1 sample). Bits, if any, between the earliest and latest bits, will be loaded in between, in either FIFO latch 3 or 4 (shown as item 1220 and 1216, respectively). The other FIFO latches (in this case 6, 7, 0 and 1 in an eight-deep FIFO) should contain all '0's. If the other FIFO latches do not contain all '0's, then it is likely that the data on the bus is too skewed to be properly de-skewed, and the bus is broken and possibly un-alignable. Fourth, by forcing the local select MUX to a fixed value, the local latch will be loaded with the contents of only one FIFO latch. Thus, using the sticky '1's detect logic, one FIFO latch can be sampled for at least one IAP pattern period (64 bit times), and if data in that FIFO ever has the '1' (first beat of the IAP pattern) loaded into it, the "one detected" signal will be set. Each FIFO latch can then be checked for '1's of the IAP pattern and the "latest" bit easily determined. Fifth, whichever FIFO latch the latest bit in the clock/data group is loaded into, this location can then be changed by incrementing or decrementing the gate counter (which determines which FIFO latch is loaded) beyond its normally-incrementing value. Thus, if the latest bit were loaded into FIFO latch 4 (shown as item 16), by decrementing the gate counter by two, this same data beat will be loaded into FIFO latch 0 (shown as item 1208). Since the gate counter is shared across all bits on the bus, earlier data bits will consequently be loaded into four-earlier FIFO latches. For the rest of the interface alignment procedure to work, the latest bit must be loaded into FIFO latch 0 (shown as item 1208) if data has been captured on a rising I/O clock edge, or FIFO latch 7 (shown as item 1224) if the data has been captured on a falling I/O clock edge.

After this gate count manipulation is done, the latest data bit or bits will be loaded with the first beat of the IAP pattern (beat 0, or the '1' of the 1 and 63 '0's pattern) in either the first FIFO latch or (FIFO 0, shown as item 1208) or last FIFO latch (FIFO 7 for elastic-8, shown as item 1224). Earlier data bits will be spread out in the three adjacent earlier FIFO latches such that the data is in four adjacent FIFO latches. By controlling the local select multiplexor, the position of the '1' of the LAP pattern can the be checked for each data bit. If a bit is in the same FIFO position as the latest data bit on the bus (FIFO 7, shown as item 1224), then no additional latch delay needs to be added to that bit. If it is one FIFO position earlier, (FIFO 7 when the latest bit is in FIFO 0, or FIFO 6 when the latest bit is in FIFO 7), then that bit can be delayed by one bit time to compensate by setting its "func_latch_delay_L1/L2" controls (shown as items 568 and 566 in FIG. 5) from 0 to 1, thereby adding one bit time of delay to the data when the normal functional data is passed through to the de-skewed L1/L2 sample (i.e., when not selecting the AND gates used to create the '1' and sixty-three '0' IAP pattern). Similarly, if any bit is found in an earlier FIFO latch, the func_latch_delay signals (shown as items 568 and 566 from FIG. 5) for that bit can be set to 2 or 3 to add the appropriate latch delays to line up all the data such that each beat of data for all bits in the clock/data group are loaded simultaneously into the same FIFO latch.

Figure 15A:
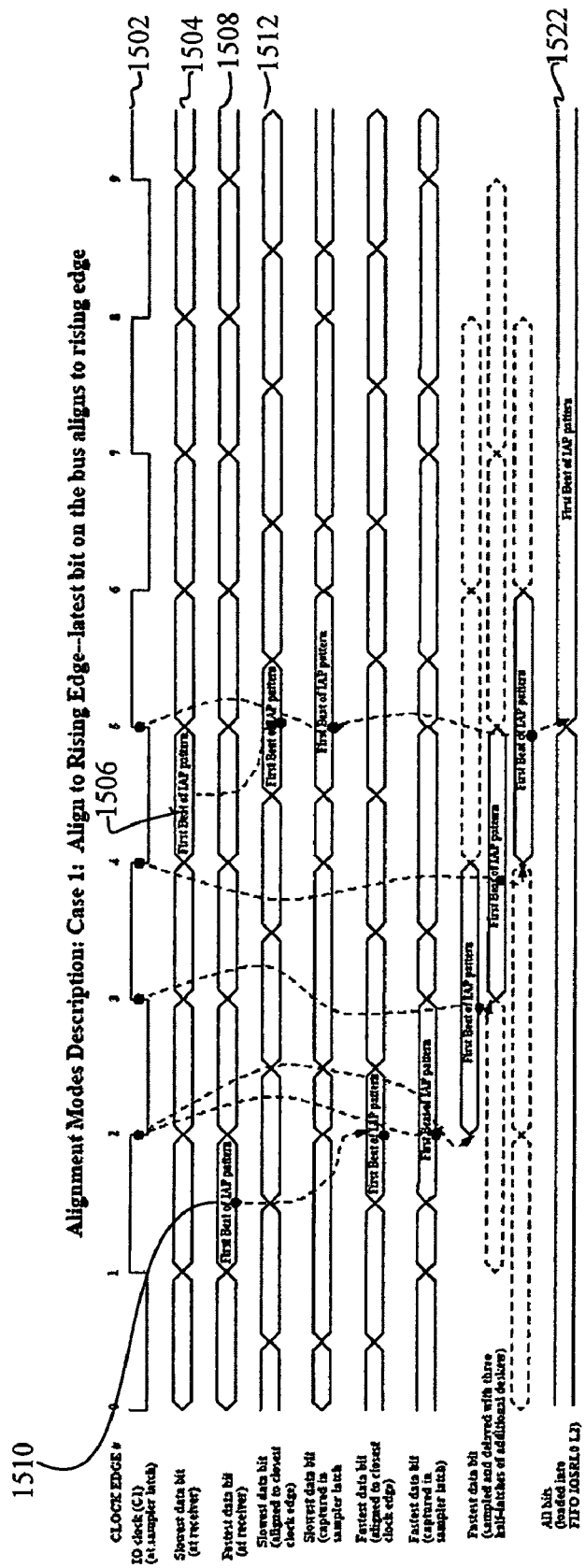
FIG. 15A is a diagram of waveforms associated with an align-to-rising-edge mode in which the latest bit on the bus aligns to a rising edge.

Referring now to FIG. 15A, an "align to rising edge" mode is shown. If analysis of data and clock path lengths indicate that the latest bit on the bus will be de-skewed and sampled such that its even data beats are sampled on the rising clock edge at the receiver, the align-to-rising-edge mode can be employed. In FIG. 15A, waveform 1504 is the latest data bit (i.e., the slowest data bit). This can be seen by comparing waveform 1504 to the clock signal 1502. As shown, the first beat 1506 of the IAP pattern occurs between the fourth and fifth clock edge of clock signal 1502. In contrast, the fastest bit of the data bit is waveform 1508. For waveform 1508, the first bit of the IAP pattern 1510 occurs between the first and second clock edges of clock 1502. Waveform 1512 represents waveform 1504 that has been delayed by up to one bit time to align the data beat centers with the closest clock edge of clock 1502. As shown in FIG. 15A, the latest bit on the bus (item 1504) gets sampled on a rising clock edge (at rising edge 5 on clock signal 1502). Therefore, even numbered data beats on this slowest data bit (waveform 1504) can immediately be loaded into the even FIFO latch as shown by waveform 1522. Consequently, no additional latches are placed in the path for that latest bit (item 1504).

In this scenario, wherein the latest bit (for example, waveform 1504) on the bus is aligned to the intended clock edge (even beats on the rising clock edges), minimum latency is added to the overall bus timing. The latest bit has only the fractional bit time of de-skew added to its path from the delay line. Furthermore, the amount of skew between the earliest and latest bits on the bus can be at least three bit times, and could approach four bit times. Also, as shown in FIG. 15A, bits sampled on earlier clock edges (up to three clock edges earlier) can then be delayed by up to three half-latches (as shown by item 1520) such that the data for all bits of the bus have a beat of data loaded into the FIFO at the same time, with even data beats loaded on a rising clock edge into the even FIFO latches.

Figure 15B:
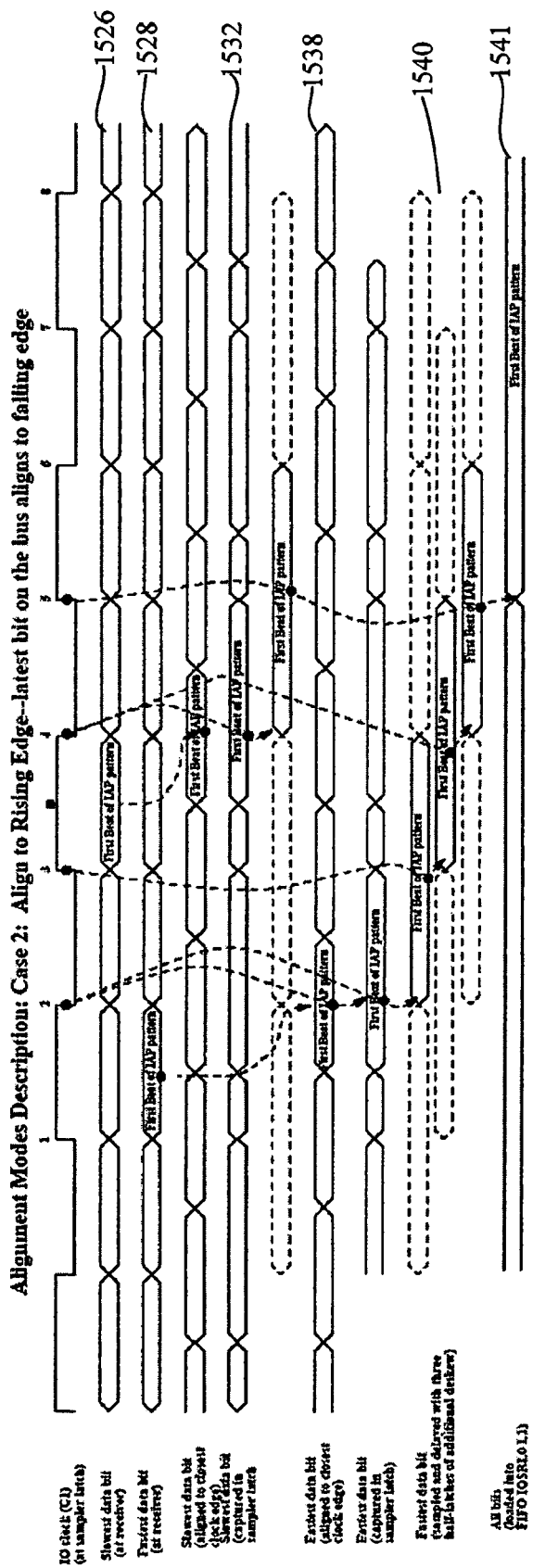
FIG. 15B is a diagram of waveforms associated with an align-to-rising-edge mode in which the latest bit on the bus aligns to a falling edge.

Referring now to FIG. 15B, if the align-to-rising edge mode is selected, and the latest bit on the bus is aligned to a falling clock edge, this latest bit will have one additional bit time of delay added. In FIG. 15B, the latest bit (waveform 1526) on the bus arrives at the receiver such that its center is falling before clock edge 4. Delay is added via the data delay line such that this latest bit (waveform 1526) is centered on rising clock edge 4 resulting in waveform 1530. This slowest, delayed, centered data bit (1530) is then sampled and then further delayed by one bit time through a single half-latch, resulting in waveform 1532. The fastest data bit (waveform 1528) on the bus arrives at the receiver such that its center is before falling clock edge 2. Delay is added via the data delay lines such that it is centered on the falling clock edge 2, resulting in waveform 1538. This fastest, delayed, and centered data bit (1538) is then sampled. That sampled data is then delayed by running it through three half-latches such that it lines up with the sample data for the latest data bit, as shown in waveforms 1540. As a result, on the rising clock edge 5, all the data bits (from the fastest to the slowest) are latched into the first latch of the FIFO.

The one additional bit time of delay added to the latest bit (1526) could be added by a half latch, such that the bit could be loaded into even FIFO latches on rising clock edges. In an embodiment of the present invention, earlier bits on the bus are similarly delayed by adding up to three bit times of delay such that all bits have a beat of data loaded into the FIFO simultaneously. Since the latest bit on the bus has one extra half latch added in its path, this adds a bit time of latency to the entire path. In such a scenario as shown in FIG. 15B, since only three half latches are available for the added bit times of de-skew, and all bits will use at least one of those half latches, there are only two remaining de-skew half latches (or two bit times) of the skewing capability between the earliest and latest data bits in the clock group.

Figure 15C:
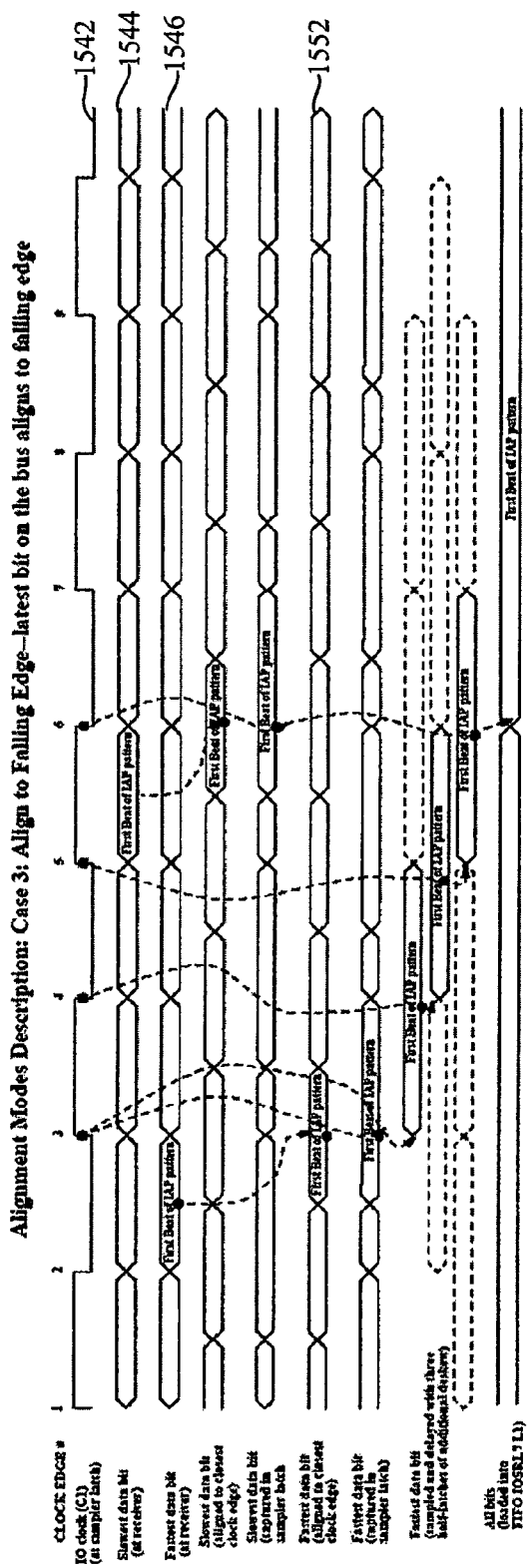
FIG. 15C is a diagram of waveforms associated with an align-to-falling-edge mode in which the latest bit on the bus aligns to falling edges.

Referring now to FIG. 15C, if analysis of data and clock path lengths indicate that the latest bit (waveform 1544) on the bus will be de-skewed and sampled such that the its even data beats are sampled on the falling clock edge (for example beat 6 on clock signal 1542) at the receiver, an align-to-falling-edge mode can be employed. If the latest bit (waveform 1544) on the bus does get sampled on a falling clock edge, as shown in FIG. 15C, then even data beats for that latest bit (waveform 1544) are loaded immediately into the odd FIFO latch as shown in waveform 1558. The even data beats for the latest bit (waveform 1544) are loaded without the need to place additional latches in the path of the latest bit (waveform 1544).

FIG. 15C shows that bits sampled on earlier clock edges (up to three clock edges earlier) can then be delayed up to three half latches such that the data for all bits of the bus have a beat of data loaded into the FIFO at the same time, with even data beats loaded on falling edges into the odd FIFO latches. Because the latest bit (waveform 1544) on the bus is aligned to the intended clock edge (edge 6 on clock signal 1542), minimum latency is added to the overall bus timing. The latest bit (waveform 1544) has only the fractional bit time of de-skew (from the delay line) added to its path. Furthermore, the amount of skew between the earliest (waveform 1546) and latest bits (for example, waveform 1544) on the bus can be at least three bit times, and could approach four bit times.

Figure 15D:
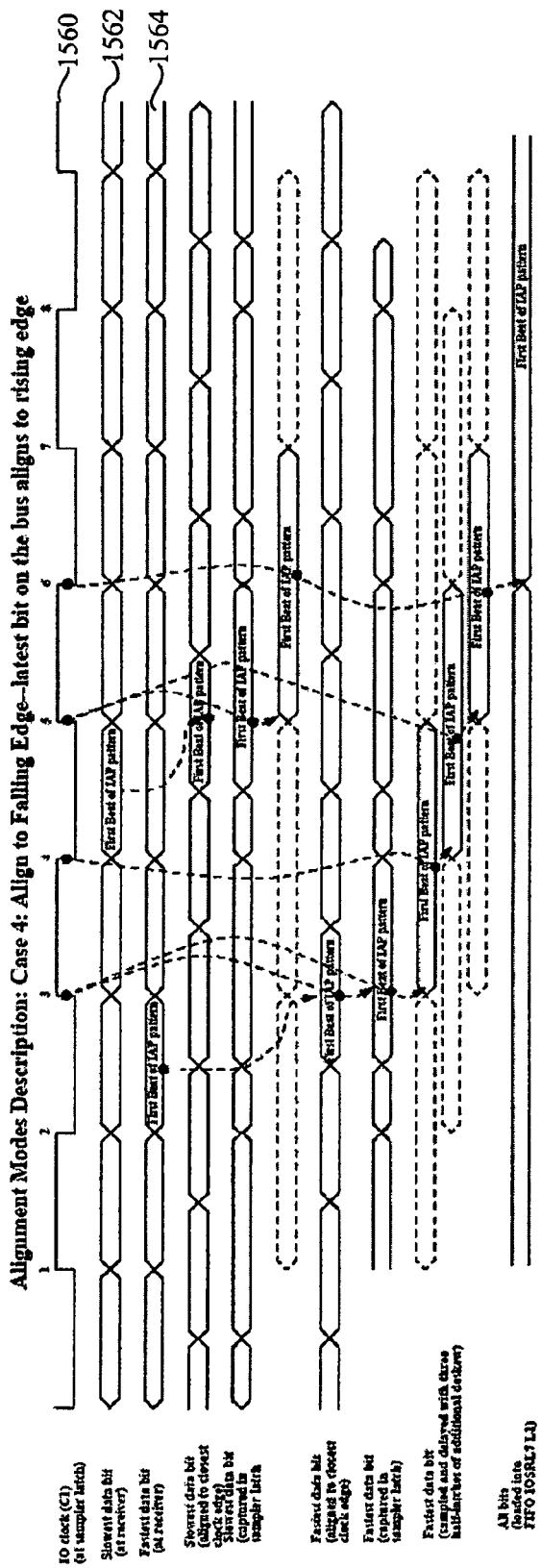
FIG. 15D is a diagram of waveforms associated with an align-to-falling-edge mode in which the latest bit on the bus aligns to rising edges.

Referring now to FIG. 15D, if in the align-to-falling edge mode, the latest bit on the bus is actually aligned to a rising clock edge, this latest bit (waveform 1562) will have one additional bit time of delay added, via a half-latch, such that it can be loaded into the odd FIFO latch on a falling clock edge (for example, edge 6 on clock signal 1560). Earlier bits on the bus (for example, waveform 1564) are similarly delayed by adding up to three bit times of delay such that all bits have a beat of data loaded into the FIFO simultaneously. Because the latest bit (waveform 1562) on the bus has one extra half-latch added in its path, this adds a bit time of latency to the entire path. Furthermore, since only three half-latches are available for the added bit times of de-skew, and all bits will use at least one of those half-latches, there are only two remaining de-skew half-latches, or two bit times, of de-skewing capability between the earliest and latest data bits in the clock group.

Instead of relying on analysis of when the latest bit in a clock group arrives with respect to its clock to determine whether to use the align-to-rise or align-to-fall modes described above, an align-to-closest-edge mode that makes the decision automatic can be implemented. If the latest bit in the clock group aligns with a rising clock edge, then that latest bit's even data beats are loaded from the sampler to the even FIFO latches as shown in FIG. 15A, with faster data bits de-skewed by adding additional half-latches of delays. If the latest bit in the clock group aligns with a falling clock edge, then that latest bit's even data beats are loaded from the sampler into the odd FIFO latches as shown in FIG. 15C, with the faster data bits de-skewed by adding half-latches of delays. This align-to-closest-edge mode thereby allows minimum added latency and maximum de-skew capability regardless of how the data aligns to clock edges.

The three alignment modes described above may have sensitivity to drift. If the latest bit on the bus aligns to the designated clock edge such that no additional latch is added (as shown in FIGS. 15A and 15C), and if the latest bit has very little delay line skew added (which basically indicates that the clock was centered in the data window without any de-skewed delay added) then if that bit were to drift later, its optimal sampling point could not be fully tracked. This is because, as a bit gets later with respect to the clock, delay is removed as part of the dynamic re-calibration process. If the added delay goes to zero, it can go no further and the sampling point becomes non-optimal. If, however, the latest bit on the bus has one added de-skew latch (as shown in FIGS. 15B and 15D), if the latest bit were to drift later, then the dynamic re-calibration algorithm will subtract delay via decrementing the delay line to zero. However, once the delay reached zero, the added latch could be removed and a full bit time of delay could be added to the delay line to compensate for it. This would result in a "wrap-back" operation of the dynamic re-calibration operation. In the "maximum drift" mode, therefore, for whatever edge the latest bit in the clock group aligns to, an additional bit time of delay is added via an added half-latch (as shown in FIGS. 15B and 15C). This thereby allows an interface to compensate for drift. This compensation, however, may cause a sacrifice of total earliest-to-latest bit skew capability. In other words, in maximum drift mode, only about two bit times of skew could be tolerated, in the examples provided herein. However, more drift could be tolerated in embodiments with additional circuitry than shown in the examples provided herein.

Although the present invention and its advantages have been described in detail, it should be understood that various changes, substitutions and alterations can be made herein without departing from the spirit and scope of the invention as defined by the appended claims.

What is claimed is:

1. A method for receiving a transmission of digital data in an elastic interface system, the method comprising the steps of:
   receiving a clock/data group on a bus resulting in a received clock/data group, wherein the received clock/data group includes:
      a clock signal, wherein the clock signal includes a plurality of clock edges; and
      a plurality of data bits, wherein the plurality of data bits includes even data beats, odd data beats, a latest data bit, and wherein corresponding bits of the clock signal and the plurality of data bits are launched onto the bus substantially simultaneously;
   delaying the plurality of data bits individually to center data windows with a nearest of the plurality of clock edges, to result in a plurality of de-skewed data bits;
   determining the latest data bit from the plurality of de-skewed data bits;
   if the latest data bit was delayed to center its data windows to a rising edge of the clock signal, loading even data beats into a plurality of even FIFO latches; and
   if the latest data bit was delayed to center its data windows to a falling edge of the clock signal:
      loading even data beats into a plurality of odd FIFO latches; and
      delaying the latest bit by a first delay time to result in a delayed, latest bit, wherein:
         the first delay time facilitates loading even data beats of the delayed, latest bit into even FIFO latches in response to the plurality of rising clock edges; and
         the first delay time is less than or equal to three bit times of the clock signal.

2. The method of claim 1, further comprising the steps of:
   determining whether the latest data bit was delayed to center its data windows with a plurality of rising clock edges or a plurality of falling clock edges; and
   if an align-to-rising-edge mode has been selected and the latest data bit was delayed to center its data windows with the plurality of rising clock edges, loading even data beats into a plurality of even FIFO latches.

3. The method of claim 2, further comprising the steps of:
   delaying a plurality of earlier de-skewed data bits to result in a plurality of aligned, earlier data bits, wherein the plurality of aligned, earlier data bits have corresponding data beats aligned with corresponding data beats of the latest data bit; and
   loading even data beats for the plurality of aligned, earlier data bits into the plurality of even FIFO latches, wherein the step of loading even data beats for the plurality of aligned, earlier data bits occurs concurrently with the step of loading even data beats into the plurality of even FIFO latches.

4. A method for receiving a transmission of digital data in an elastic interface system, the method comprising the steps of:
- receiving a clock/data group on a bus resulting in a received clock/data group, wherein the received clock/data group includes:
  - a clock signal, wherein the clock signal includes a plurality of clock edges; and
  - a plurality of data bits, wherein the plurality of data bits includes even data beats, odd data beats, a latest data bit, and wherein corresponding bits of the clock signal and the plurality of data bits are launched onto the bus substantially simultaneously;
- delaying the plurality of data bits individually to center data windows with a nearest of the plurality of clock edges, to result in a plurality of de-skewed data bits;
- determining the latest data bit from the plurality of de-skewed data bits;
- if the latest data bit was delayed to center its data windows to a rising edge of the clock signal, loading even data beats into a plurality of even FIFO latches; and
- if the latest data bit was delayed to center its data windows to a falling edge of the clock signal, loading even data beats into a plurality of odd FIFO latches;
- determining whether the latest data bit was delayed to center its data windows with the plurality of rising clock edges or the plurality of falling clock edges;
- if an align-to-falling-edge mode has been selected and the latest data bit was delayed to center its data windows with the plurality of all falling clock edges, loading the latest data bit's plurality of even data beats into a plurality of odd FIFO latches;
- delaying a plurality of earlier de-skewed data bits to result in a plurality of aligned, earlier data bits, wherein the plurality of aligned, earlier data bits have corresponding data beats aligned with corresponding data beats of the latest data bit; and
- loading even data beats for the plurality of aligned, earlier data bits into the plurality of odd FIFO latches, wherein the step of loading even data beats for the plurality of aligned, earlier data bits occurs concurrently with the step of loading the latest data bit's plurality of even data beats into the plurality of odd FIFO latches;
- wherein the step of delaying the latest data bit is accomplished by sending the latest data bit through a latch.

5. The method of claim 4, further comprising the steps of:
- if the latest data bit was delayed to center its data windows with the plurality of rising clock edges, delaying the latest bit by a first delay time to result in a delayed, latest bit, wherein the first delay time facilitates loading even data beats of the delayed, latest bit into odd FIFO latches in response to the plurality of falling clock edges.

6. The method of claim 4, wherein the first delay time is less than a period equal to three bit times of the clock signal.

7. The method of claim 1, wherein:
- if an align-to-closest-edge-plus-1 mode has been selected, the method of claim 1 further comprises the step of:
- further delaying the latest data bit by a second time amount to result in a further delayed latest data bit;
- if the latest data bit was delayed to center its data windows with the plurality of rising clock edges, loading the further delayed latest data bit's plurality of even data beats into a plurality of even FIFO latches; and
- if an align-to-closest-edge mode has been selected and the latest data bit was delayed to center its data windows with the plurality of falling clock edges, loading the further delayed latest data bit's plurality of even data beats into a plurality of odd FIFO latches.

8. A circuit for receiving a transmission of digital data in an elastic interface system, the circuit comprising:
- a receiver for receiving a clock/data group on a bus resulting in a received clock/data group, wherein the received clock/data group comprises:
  - a clock signal, wherein the clock signal includes a plurality of clock edges; and
  - a plurality of data bits, wherein each of the plurality of data bits includes a plurality of even data beats, odd data beats, a latest data bit, and wherein corresponding bits of the clock signal and the plurality of data bits are launched onto the bus substantially simultaneously;
- a first delay line for delaying the plurality of data bits individually to center data windows with a nearest of the plurality of clock edges, to result in a plurality of de-skewed data bits;
- a first logic circuit for determining a latest data bit from the plurality of de-skewed data bits;
- a second logic circuit for determining an alignment mode selection;
- a third logic circuit for loading the latest data bit's plurality of even data beats into a plurality of even FIFO latches if:
  - the alignment mode selection is align-to-closest-edge; and
  - the latest data bit was delayed to center its data windows with the plurality of rising clock edges;
- a fourth logic circuit for loading the latest data bit's plurality of even data beats into a plurality of odd FIFO latches if:
  - the alignment mode selection is an align-to-closest-edge mode; and
  - the latest data bit was delayed to center its data windows with the plurality of falling clock edges;
- second delay line for delaying the latest bit by a first delay time to result in a delayed, latest bit if the latest data bit was delayed to center its data windows with the plurality of falling clock edges, wherein:
  - the first delay time facilitates loading even data beats of the delayed, latest bit into even FIFO latches in response to the plurality of rising clock edges; and
  - the first delay time is less than or equal to three bit times of the clock signal.

9. The circuit of claim 8 for receiving a transmission of digital data, the circuit further comprising:
- a fifth logic circuit for determining whether the latest data bit was delayed to center its data windows with the plurality of rising clock edges or the plurality of falling clock edges; and
- a sixth logic circuit for loading the latest data bit's plurality of even data beats into a plurality of even FIFO latches if an align-to-rising-edge mode has been selected and the latest data bit was delayed to center its data windows with the plurality of rising clock edges.

10. The circuit of claim 9 for receiving a transmission of digital data, the circuit further comprising:
- a second delay line for delaying a plurality of earlier de-skewed data bits to result in a plurality of aligned, earlier data bits, wherein the plurality of aligned, earlier data bits have corresponding data beats aligned with corresponding data beats of the latest data bit; and
- a seventh logic circuit for loading even data beats for the plurality of aligned, earlier data bits into the plurality of even FIFO latches, wherein loading even data beats for the plurality of aligned, earlier data bits occurs concurrently with loading the latest data bit's plurality of even data beats into the plurality of even FIFO latches.

11. The circuit of claim 8 for receiving a transmission of digital data, the circuit further comprising:
   a fifth logic circuit for determining whether the latest data bit was delayed to center its data windows with the plurality of rising clock edges or the plurality of falling clock edges; and
   a sixth logic circuit for loading the latest data bitts plurality of even data beats into a plurality of odd FIFO latches if:
      the alignment mode selection is an align-to-falling-edge mode; and
      the latest data bit was delayed to center its data windows with the plurality of all falling clock edges.

12. The circuit of claim 11 for receiving a transmission of digital data, the circuit further comprising:
   a second delay line for delaying a plurality of earlier de-skewed data bits to result in a plurality of aligned, earlier data bits, wherein the plurality of aligned, earlier data bits have corresponding data beats aligned with corresponding data beats of the latest data bit; and
   a seventh logic circuit for loading even data beats for the plurality of aligned, earlier data bits into the plurality of odd FIFO latches, wherein loading even data beats for the plurality of aligned, earlier data bits occurs concurrently with the step of loading the latest data bit's plurality of even data beats into the plurality of odd FIFO latches.

13. The circuit of claim 12 for receiving a transmission of digital data, the circuit further comprising:
   a third delay line for delaying the latest bit by a first delay time to result in a delayed, latest bit, wherein the third delay line delays the latest bit by a first delay time if the latest data bit was delayed to center its data windows with the plurality of rising clock edges, wherein the first delay time facilitates loading even data beats of the delayed, latest bit into odd FIFO latches in response to the plurality of falling clock edges.

14. The circuit of claim 8 for receiving a transmission of digital data, the circuit further comprising:
   a second delay line for further delaying the latest data bit by a second time amount to result in a further delayed latest data bit, wherein the second delay line delays the latest bit by the second time amount if the alignment mode selection is an align-to-closest-edge-plus-1 mode;
   a fifth logic circuit for loading the further delayed latest bit's plurality of even data beats into a plurality of even FIFO latches if the latest data bit was delayed to center its data windows with the plurality of rising clock edges; and
   a sixth logic circuit for loading the further delayed latest data bit's plurality of even data beats into a plurality of odd FIFO latches if an align-to-closest-edge mode has been selected and the latest data bit was delayed to center its data windows with the plurality of falling clock edges.

* * * * *